United States Patent
Min et al.

(10) Patent No.: US 12,166,093 B2
(45) Date of Patent: Dec. 10, 2024

(54) SEMICONDUCTOR DEVICES INCLUDING EPITAXIAL PATTERNS WITH PLURALITY OF FIN-SHAPED PATTERNS

(71) Applicant: Samsung Electronics Co., Ltd., Suwon-si (KR)

(72) Inventors: Sun Ki Min, Seoul (KR); Chae Ho Na, Changwon-si (KR); Sang Koo Kang, Yongin-si (KR); Ik Soo Kim, Yongin-si (KR); Dong Hyun Roh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 283 days.

(21) Appl. No.: 17/216,903

(22) Filed: Mar. 30, 2021

(65) Prior Publication Data

US 2022/0069092 A1    Mar. 3, 2022

(30) Foreign Application Priority Data

Aug. 31, 2020 (KR) .................. 10-2020-0109994

(51) Int. Cl.
| | |
|---|---|
| *H01L 29/417* | (2006.01) |
| *H01L 23/535* | (2006.01) |
| *H01L 27/092* | (2006.01) |
| *H01L 29/423* | (2006.01) |
| *H01L 29/786* | (2006.01) |

(52) U.S. Cl.
CPC ...... *H01L 29/41733* (2013.01); *H01L 23/535* (2013.01); *H01L 27/092* (2013.01); *H01L 29/42392* (2013.01); *H01L 29/78696* (2013.01)

(58) Field of Classification Search
CPC ......... H01L 29/41733; H01L 29/42392; H01L 29/78696; H01L 29/785; H01L 29/0847; H01L 23/535; H01L 23/485; H01L 23/5283; H01L 23/481; H01L 27/092; H01L 21/823821; H01L 21/823814; H01L 21/76895; H01L 21/823871; H01L 21/823878; H01L 27/0924; H01L 21/76805; H01L 21/76897; H01L 21/76829

See application file for complete search history.

(56) References Cited

U.S. PATENT DOCUMENTS

| | | |
|---|---|---|
| 9,117,842 B2 | 8/2015 | Wei et al. |
| 9,941,277 B2 | 4/2018 | Yoon et al. |

(Continued)

FOREIGN PATENT DOCUMENTS

KR    20200037053 A    4/2020

*Primary Examiner* — Kimberly N Rizkallah
*Assistant Examiner* — Zhijun Xu
(74) *Attorney, Agent, or Firm* — Myers Bigel, P.A.

(57) ABSTRACT

A semiconductor device may include first and second fin-shaped patterns on a substrate, that extend in a first direction, and are spaced apart from each other in a second direction. A first epitaxial pattern may be on the first fin-shaped pattern, and a second epitaxial pattern may be on the second fin-shaped pattern. A field insulating layer may be on the substrate, and may cover a sidewall of the first fin-shaped pattern, a sidewall of the second fin-shaped pattern, a part of a sidewall of the first epitaxial pattern, and a part of a sidewall of the second epitaxial pattern. The top surface of the field insulating layer may be higher than the bottom surface of the first epitaxial pattern and the bottom surface of the second epitaxial pattern.

19 Claims, 30 Drawing Sheets

(56) References Cited

U.S. PATENT DOCUMENTS

| | | | |
|---|---|---|---|
| 10,157,987 B1 | 12/2018 | Liaw | |
| 10,522,423 B2 | 12/2019 | Liaw | |
| 10,643,995 B2 | 5/2020 | Yoon et al. | |
| 2015/0340471 A1* | 11/2015 | Lim | H01L 21/823431 |
| | | | 438/283 |
| 2016/0148998 A1* | 5/2016 | Wu | H01L 27/0924 |
| | | | 257/369 |
| 2018/0158954 A1* | 6/2018 | Matsumoto | H01L 21/385 |
| 2018/0190504 A1* | 7/2018 | Lee | H01L 29/6656 |
| 2019/0164822 A1* | 5/2019 | Chou | H01L 29/66795 |
| 2020/0075421 A1* | 3/2020 | Wu | H01L 21/823431 |
| 2020/0105936 A1* | 4/2020 | More | H01L 29/41791 |
| 2020/0119001 A1* | 4/2020 | Shu | H01L 29/41791 |
| 2020/0135585 A1* | 4/2020 | Lee | H01L 21/02164 |
| 2020/0212035 A1* | 7/2020 | Jung | H01L 21/823431 |

\* cited by examiner

SEMICONDUCTOR DEVICES INCLUDING EPITAXIAL PATTERNS WITH PLURALITY OF FIN-SHAPED PATTERNS

CROSS-REFERENCE TO RELATED APPLICATION

This application claims priority from Korean Patent Application No. 10-2020-0109994 filed on Aug. 31, 2020 in the Korean Intellectual Property Office, and all the benefits accruing therefrom under 35 U.S.C. 119, the entire contents of which are herein incorporated by reference.

BACKGROUND

1. Technical Field

The present disclosure relates to semiconductor devices.

2. Description of the Related Art

Various scaling techniques for increasing the density of semiconductor devices have been proposed. One proposed scaling technique utilizes multi-gate transistors, in which a fin- or nanowire-shaped multi-channel active pattern (or silicon body) is formed on a substrate and a gate is formed on the surface of the multi-channel active pattern.

Since a multi-gate transistor uses a three-dimensional (3D) channel, scaling of the multi-gate transistor may be achieved. Current control capability can be improved without increasing the gate length of the multi-gate transistor. In addition, a short channel effect (SCE), in which the potential of a channel region is affected by a drain voltage, can be effectively suppressed.

SUMMARY

Aspects of the present disclosure provide semiconductor devices with improved reliability and performance characteristics.

However, aspects of the present disclosure are not restricted to those explicitly set forth herein. The above and other aspects of the present disclosure will become more apparent to one of ordinary skill in the art to which the present disclosure pertains by referencing the detailed description of the present disclosure given below.

According to some aspects of the present disclosure, there is provided a semiconductor device comprising, a first fin-shaped pattern on a substrate, the first fin-shaped pattern extending in a first direction, a second fin-shaped pattern on the substrate, the second fin-shaped pattern extending in the first direction and spaced apart from the first fin-shaped pattern in a second direction, a first epitaxial pattern on the first fin-shaped pattern, the first epitaxial pattern including a bottom surface connected to the first fin-shaped pattern, a second epitaxial pattern on the second fin-shaped pattern, the second epitaxial pattern including a bottom surface connected to the second fin-shaped pattern and separated from the first epitaxial pattern, a field insulating layer on the substrate, the field insulating layer covering a sidewall of the first fin-shaped pattern, a sidewall of the second fin-shaped pattern, a part of a sidewall of the first epitaxial pattern, and a part of a sidewall of the second epitaxial pattern, an etch stop layer extending along a top surface of the field insulating layer, the sidewall of the first epitaxial pattern, and the sidewall of the second epitaxial pattern, and in contact with the field insulating layer; and a source/drain contact on the first epitaxial pattern and the second epitaxial pattern, the source/drain contact connected to the first epitaxial pattern and the second epitaxial pattern, wherein the top surface of the field insulating layer is higher than the bottom surface of the first epitaxial pattern and the bottom surface of the second epitaxial pattern.

According to some aspects of the present disclosure, there is provided a semiconductor device comprising, a first epitaxial pattern and a second epitaxial pattern in a first region of a substrate and separated from each other by a first distance, a third epitaxial pattern and a fourth epitaxial pattern in a second region of the substrate and separated from each other by a second distance, a first field insulating layer that covers a part of a sidewall of the first epitaxial pattern and a part of a sidewall of the second epitaxial pattern on the substrate between the first epitaxial pattern and the second epitaxial pattern, a second field insulating layer that covers a part of a sidewall of the third epitaxial pattern and a part of a sidewall of the fourth epitaxial pattern on the substrate between the third epitaxial pattern and the fourth epitaxial pattern, a first etch stop layer that extends along a top surface of the first field insulating layer, a sidewall of the first epitaxial pattern, and a sidewall of the second epitaxial pattern, and in contact with the first field insulating layer, a second etch stop layer that extends along a top surface of the second field insulating layer, a sidewall of the third epitaxial pattern, and a sidewall of the fourth epitaxial pattern, and in contact with the second field insulating layer, a first source/drain contact that is connected to the first epitaxial pattern and the second epitaxial pattern, and a second source/drain contact that is connected to the third epitaxial pattern and the fourth epitaxial pattern, wherein each of the first epitaxial pattern and the third epitaxial pattern includes a facet intersection point along a sidewall thereof where its width in the second direction is at a maximum, the first distance is smaller than the second distance, and a depth from the facet intersection point of the first epitaxial pattern to the top surface of the first field insulating layer is smaller than a depth from the facet intersection point of the third epitaxial pattern to the top surface of the second field insulating layer.

According to some aspects of the present disclosure, there is provided a semiconductor device comprising, a first fin-shaped pattern disposed in a PMOS region of a substrate, extending in a first direction, and defined by a fin trench, a second fin-shaped pattern disposed in an NMOS region of the substrate, spaced apart from the first fin-shaped pattern in a second direction, extending in the first direction, and defined by the fin trench, a first epitaxial pattern on the first fin-shaped pattern, the first epitaxial pattern including a bottom surface connected to the first fin-shaped pattern, a second epitaxial pattern on the second fin-shaped pattern, the second epitaxial pattern separated from the first epitaxial pattern and including a bottom surface connected to the second fin-shaped pattern, a field insulating layer on the substrate, the field insulating layer covering a sidewall of the first fin-shaped pattern, a sidewall of the second fin-shaped pattern, a part of a sidewall of the first epitaxial pattern, and a part of a sidewall of the second epitaxial pattern, an etch stop layer extending along a top surface of the field insulating layer, the sidewall of the first epitaxial pattern, and the sidewall of the second epitaxial pattern, and in contact with the field insulating layer; and a source/drain contact on the first epitaxial pattern and the second epitaxial pattern, the source/drain contact connected to the first epitaxial pattern and the second epitaxial pattern, wherein the source/drain contact includes a first portion that vertically overlaps the first epitaxial pattern, and a second portion that vertically overlaps the second epitaxial pattern, and a height from a bottom surface of the fin trench to a bottom surface of the first portion of the source/drain contact at a portion that overlaps the first fin-shaped pattern is greater than a height from the bottom surface of the fin trench to a bottom surface of the second portion of the source/drain contact at a portion that overlaps the second fin-shaped pattern.

BRIEF DESCRIPTION OF THE DRAWINGS

The above and other aspects and features of the present disclosure will become more apparent from reviewing in detail some exemplary embodiments thereof described herein and with reference to the attached drawings, in which.

DETAILED DESCRIPTION

Although the drawings illustratively show embodiments in which semiconductor devices include certain types of transistors, such as a fin-type field effect transistor (e.g., FinFET) including a channel region having a fin-shaped pattern, or such as a transistor including nanowires or nanosheets, the present disclosure is not limited thereto. The inventive concepts of the present disclosure are applicability to semiconductor devices including other transistors, such as transistors based on two-dimensional materials (e.g., 2D material based FETs) and heterostructures thereof.

Further, some semiconductor devices according to some embodiments may include a tunneling FET or a three-dimensional (3D) transistor. Semiconductor devices according to some embodiments may include a bipolar junction transistor, a lateral double diffusion MOS (LDMOS) transistor, or the like.

Figure 1:
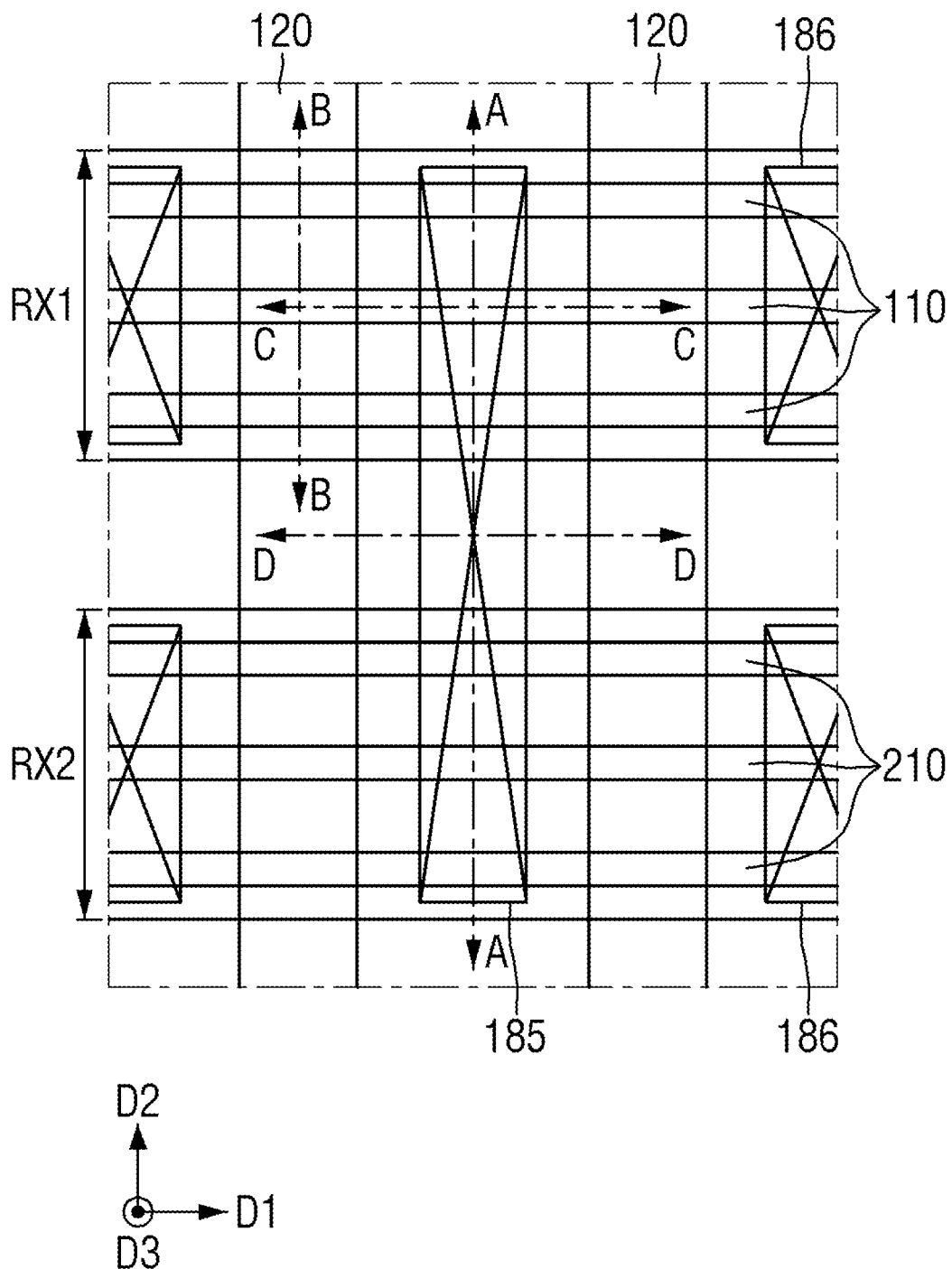
FIG. 1 is an exemplary layout diagram illustrating a semiconductor device according to some embodiments.

FIG. 1 is an exemplary layout diagram illustrating a semiconductor device according to some embodiments. FIGS. 2 to 5 are cross-sectional views taken along lines A-A, B-B, C-C and D-D of FIG. 1, respectively. For simplicity of description and ease of illustration, interlayer insulating layers 191, 192, and 193 and wiring structures 205 and 215 are not illustrated in FIG. 1.

Referring to FIGS. 1 to 5, the semiconductor device according to some embodiments may include a substrate 100, a first fin-shaped pattern 110, a second fin-shaped pattern 210, a first field insulating layer 105, a first gate electrode 120, a first epitaxial pattern 150, a second epitaxial pattern 250, a first etch stop layer 195, and a first source/drain contact 185.

The substrate 100 may be a bulk silicon or silicon-on-insulator (SOI) substrate. Alternatively, the substrate 100 may be a silicon substrate, or may include other materials such as silicon germanium, silicon germanium on insulator (SGOI), indium antimonide, a lead tellurium compound, indium arsenide, indium phosphide, gallium arsenide, or gallium antimonide, with the present disclosure not being limited thereto.

The first fin-shaped pattern 110 may be on the substrate 100. The first fin-shaped pattern 110 may be formed in a first active region RX1 of the substrate 100. The first fin-shaped pattern 110 may be elongated along a first direction D1. The first fin-shaped pattern 110 may be defined by a fin trench FT extending in the first direction D1. The fin trench FT may define the sidewall of the first fin-shaped pattern 110.

The second fin-shaped pattern 210 may be on the substrate 100. The second fin-shaped pattern 210 may be formed in a second active region RX2. The second fin-shaped pattern 210 may be elongated along the first direction D1. The second fin-shaped pattern 210 may be defined by the fin trench FT extending in the first direction D1. The second fin-shaped pattern 210 may be spaced apart from the first fin-shaped pattern 110 in a second direction D2. In other words, the first fin-shaped pattern 110 may extend in parallel or substantially in parallel with the second fin-shaped pattern 210.

Here, the first direction D1 may intersect the second direction D2 and a third direction D3. Further, the second direction D2 may intersect the third direction D3. The third direction D3 may be a direction perpendicular to the top surface of the substrate 100.

The first active region RX1 and the second active region RX2 may be defined by a deep trench DT that is deeper than the fin trench FT. In other words, a bottom of the deep trench DT may be located closer to a bottom surface of the substrate 100 than a bottom of the fin trench FT. The deep trench DT may be elongated in the first direction D1. The deep trench DT may be formed between the first fin-shaped pattern 110 and the second fin-shaped pattern 210. In the semiconductor device according to some embodiments, the deep trench DT may delimit the first active region RX1 and the second active region RX2.

In some embodiments, one of the first active region RX1 and the second active region RX2 may be an NMOS forming region, and the other one may be a PMOS forming region. In some embodiments, the first active region RX1 and the second active region RX2 may be PMOS forming regions. In some embodiments, the first active region RX1 and the second active region RX2 may be NMOS forming regions. Accordingly, in the semiconductor devices described herein, the first active region RX1 may be an NMOS forming region and the second active region RX2 may be a PMOS forming region, with the present disclosure not being limited thereto.

Each of the first fin-shaped pattern 110 and the second fin-shaped pattern 210 may be a part of the substrate 100 and may include an epitaxial layer grown from the substrate 100. Each of the first fin-shaped pattern 110 and the second fin-shaped pattern 210 may include an elemental semiconductor material, such as, for example, silicon or germanium. Additionally and/or alternatively, the first fin-shaped pattern 110 and the second fin-shaped pattern 210 may include a compound semiconductor, for example, a group IV-IV compound semiconductor or a group III-V compound semiconductor.

The group IV-IV compound semiconductor may be a binary compound or a ternary compound including at least two elements selected from the group consisting of carbon (C), silicon (Si), germanium (Ge) and tin (Sn), or the above-mentioned compound doped with a group IV element. The group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimony (Sb) which are group V elements. In some embodiments, the first fin-shaped pattern 110 and the second fin-shaped pattern 210 may contain the same material. In some embodiments, the first fin-shaped pattern 110 and the second fin-shaped pattern 210 may contain different materials.

Figure 2:
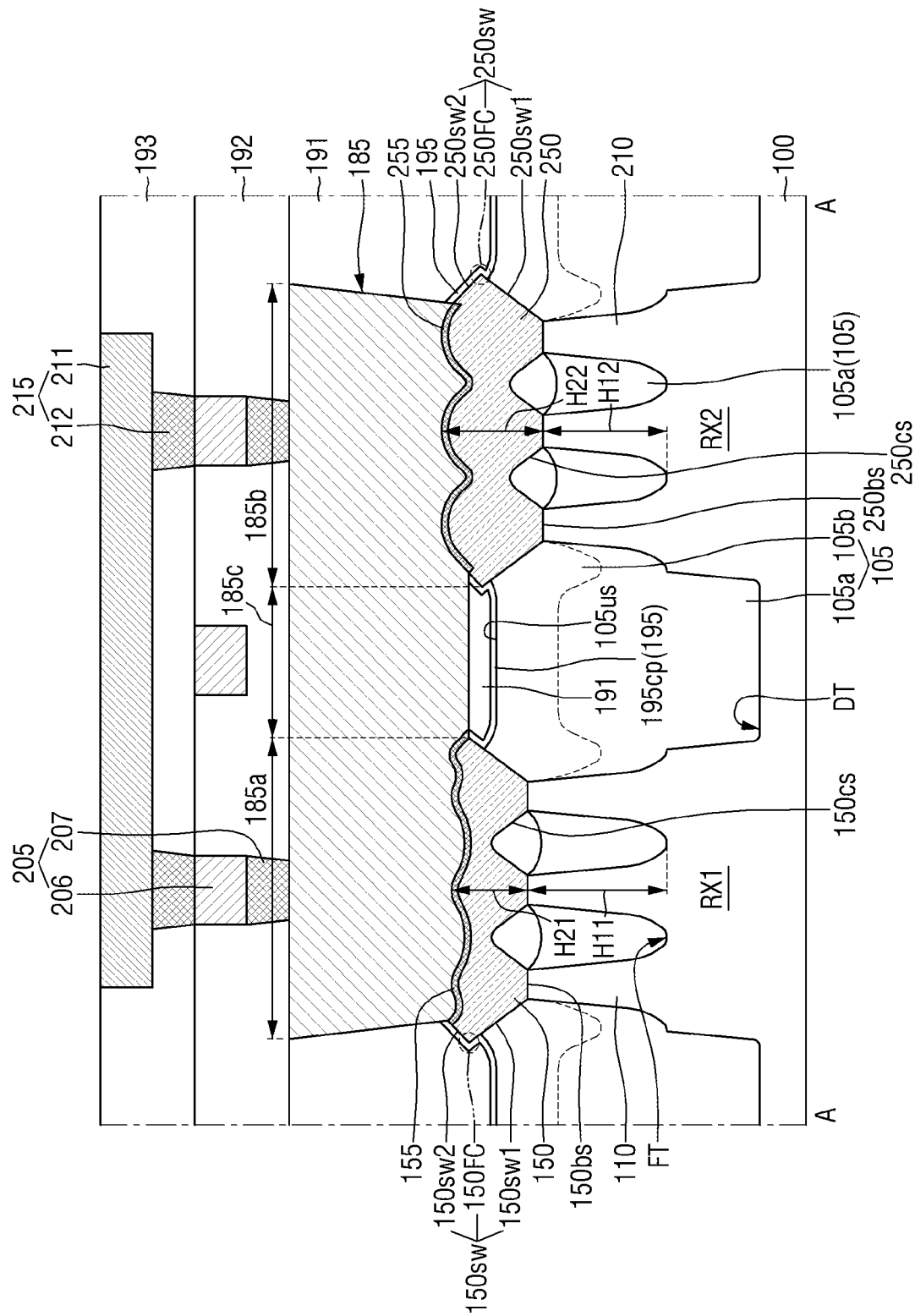
FIGS. 2 to 5 are cross-sectional views taken along lines A-A, B-B, C-C and D-D of FIG. 1, respectively.
Figure 3:
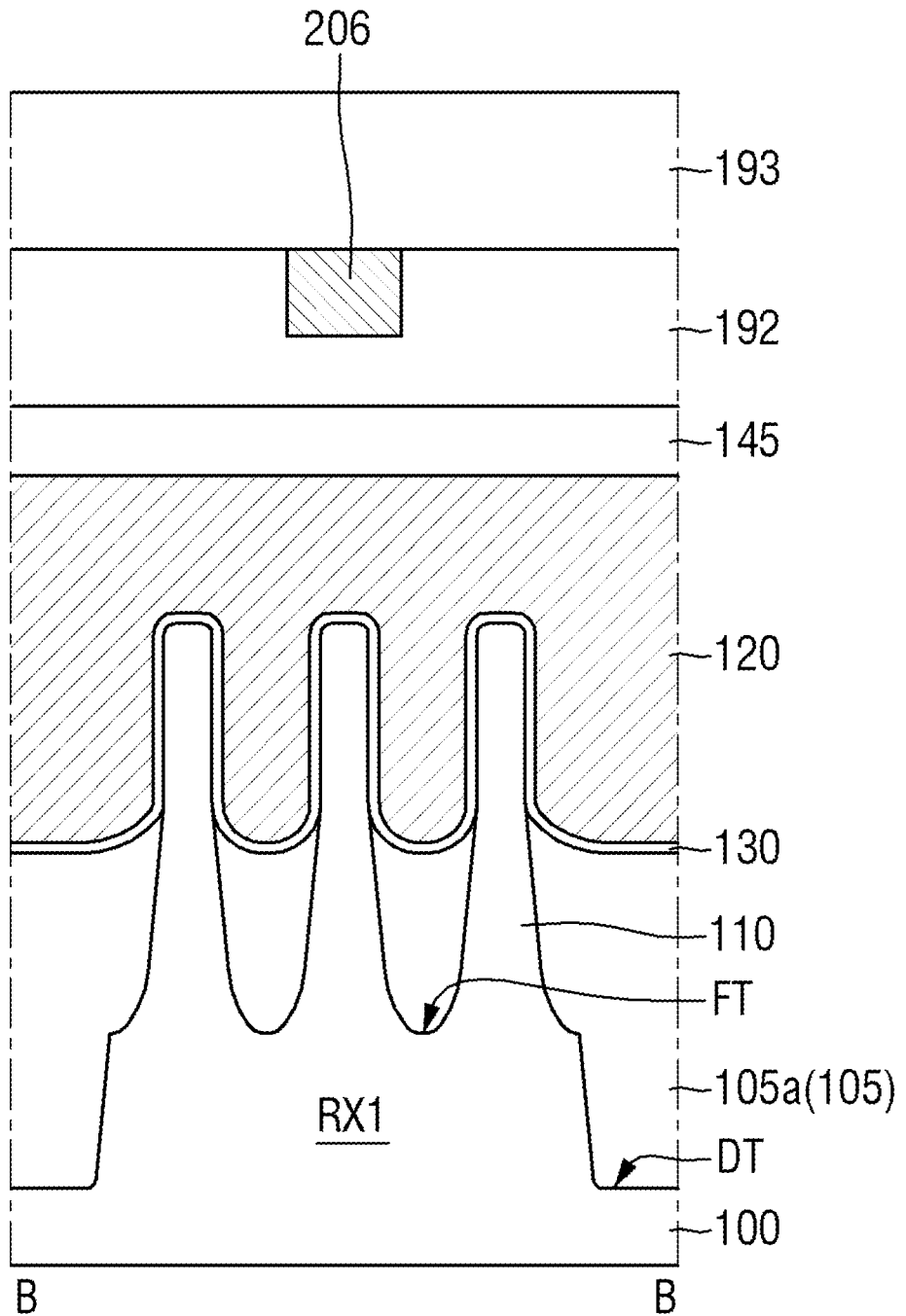

A number of first fin-shaped patterns 110 may be formed in the first active region RX1, with fin trenches FT therebetween. Three first fin-shaped patterns 110 are shown in FIGS. 2 and 3. A number of second fin-shaped patterns 210 may be formed in the second active region RX2, with fin trenches FT therebetween. Three second fin-shaped patterns 110 are shown in FIG. 2. Although it is illustrated that the number of the first fin-shaped patterns 110 in the first active region RX1 is the same as the number of the second fin-shaped patterns 210 in the second active region RX2, the present disclosure is not limited thereto. Further, although it is illustrated that three first fin-shaped patterns 110 are in the first active region RX1 and three second fin-shaped patterns 210 are in the second active region RX2, the present disclosure is not limited thereto. For example, the number of the first fin-shaped patterns 110 in the first active region RX1 and the number of the second fin-shaped patterns 210 in the second active region RX2 may be four or more.

The first field insulating layer 105 may be formed on the substrate 100. The first field insulating layer 105 may fill the deep trench DT. The first field insulating layer 105 may fill a part of the fin trench FT.

The first field insulating layer 105 may be arranged around the first fin-shaped pattern 110 and the second fin-shaped pattern 210. The first field insulating layer 105 may cover at least a part of the sidewall of the first fin-shaped pattern 110 and at least a part of the sidewall of the second fin-shaped pattern 210. A part of the first fin-shaped pattern 110 and a part of the second fin-shaped pattern 210 may protrude more upward than the top surface of the first field insulating layer 105.

The first field insulating layer 105 may include a first lower field insulating layer 105a and a first supporting field insulating layer 105b. The first supporting field insulating layer 105b may be on the first lower field insulating layer 105a.

The first lower field insulating layer 105a may fill a part of the fin trench FT and the deep trench DT. For example, the first lower field insulating layer 105a may be formed on the substrate 100 overlapping the first gate electrode 120 in the third direction D3. The first lower field insulating layer 105a may also be formed on the substrate 100 between the first gate electrodes 120. The first lower field insulating layer 105a may be between the first fin-shaped patterns 110 adjacent in the second direction D2 and the second fin-shaped patterns 210 adjacent in the second direction D2. A part of the first fin-shaped pattern 110 and a part of the second fin-shaped pattern 210 may protrude more upward than the top surface of the first lower field insulating layer 105a.

The first supporting field insulating layer 105b may be formed on the substrate 100 between the first gate electrodes 120. However, the first supporting field insulating layer 105b might not be formed on the substrate 100 overlapping the first gate electrode 120 in the third direction D3.

The first field insulating layer 105 may be on both sides of the first active region RX1 where the first fin-shaped patterns 110 are formed, and on both sides of the second active region RX2 where the second fin-shaped patterns 210 are formed. However, the following description will focus on the first field insulating layer 105 between the first active region RX1 and the second active region RX2.

The first field insulating layer 105 may include, e.g., an oxide film, a nitride film, an oxynitride film, or a combination film thereof. The first field insulating layer 105 may contain impurities contained in the film. For example, the first field insulating layer 105 may contain fluorine (F). In some embodiments, the concentration of fluorine contained in the first lower field insulating layer 105a is higher than the concentration of fluorine contained in the first supporting field insulating layer 105b. In some embodiments, the first lower field insulating layer 105a does not contain fluorine, and the first supporting field insulating layer 105b may contain fluorine. However, the present disclosure is not limited thereto.

Both the first lower field insulating layer 105a and the first supporting field insulating layer 105b may contain an oxide-based material. In some embodiments, the boundary between the first lower field insulating layer 105a and the first supporting field insulating layer 105b may not be distinguishable.

In some embodiments, the boundary between the first lower field insulating layer 105a and the first supporting field insulating layer 105b may be distinguishable. When the boundary between the first lower field insulating layer 105a and the first supporting field insulating layer 105b is distinguishable, the boundary (e.g., a boundary line) between the first lower field insulating layer 105a and the first supporting field insulating layer 105b may be visible. Alternatively, the boundary line between the first lower field insulating layer 105a and the first supporting field insulating layer 105b might not be visible, and the first lower field insulating layer 105a and the first supporting field insulating layer 105b may nevertheless be distinguishable based on whether or not they contain fluorine.

In FIG. 2, the boundary between the first lower field insulating layer 105a and the first supporting field insulating layer 105b may have a W shape, but the present disclosure is not limited thereto.

The first gate electrode 120 may be on the first field insulating layer 105. The first gate electrode 120 may not be on the first supporting field insulating layer 105b. The first gate electrode 120 may extend in the second direction D2. The adjacent first gate electrodes 120 may be spaced apart from each other in the first direction D1.

The first gate electrode 120 may intersect the first fin-shaped pattern 110 and the second fin-shaped pattern 210. The first gate electrode 120 may be on the first fin-shaped pattern 110 and the second fin-shaped pattern 210. The first gate electrode 120 may surround the portions of the first fin-shaped pattern 110 and the second fin-shaped pattern 210 that protrude above the first field insulating layer 105, or are more upward than the top surface of the first field insulating layer 105. For example, the first gate electrode 120 may surround the portions of the first fin-shaped pattern 110 and the second fin-shaped pattern 210 that protrude more upward than the top surface of the first lower field insulating layer 105a.

The first gate electrode 120 may include, for example, at least one selected from the group consisting of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof, without limitation.

In some example embodiments, and differing from the illustrated example, the first gate electrode 120 may not be contiguous and may have a first portion that intersects the first fin-shaped pattern 110 and a second portion that intersects the second fin-shaped pattern 210. In this case, a gate separation pattern that separates the portions of the first gate electrode 120 may be between the first portion of the first gate electrode 120 and the second portion of the first gate electrode 120.

Between the first gate electrodes 120 adjacent in the second direction D2, a part of the first field insulating layer 105 may extend or protrude more upward than the bottom surface of the first gate electrode 120 in the third direction D3. The first supporting field insulating layer 105b may extend or protrude more upward than the bottom surface of the first gate electrode 120 in the third direction D3. With respect to the top surface of the substrate 100, a top surface 105us of the first field insulating layer 105 that is between the first gate electrodes 120 may be higher than the bottom surface of the first gate electrode 120.

The gate spacer 140 may be on the sidewall of the first gate electrode 120. The gate spacer 140 may extend in the second direction D2. The gate spacer 140 may include, for example, at least one of silicon nitride (SiN), silicon oxynitride (SiON), silicon oxide (SiO2), silicon oxynitride (SiOCN), silicon boron nitride (SiBN), silicon oxyboron nitride (SiOBN), silicon oxycarbide (SiOC), or combinations thereof, without limitation.

A gate insulating layer 130 may extend along the sidewall and the bottom surface of the first gate electrode 120. The gate insulating layer 130 may be between the first gate electrode 120 and the first fin-shaped pattern 110, between the first gate electrode 120 and the second fin-shaped pattern 210, and between the first gate electrode 120 and the first field insulating layer 105. The gate insulating layer 130 may be between the gate electrode 120 and the gate spacer 140. In some embodiments, the first gate electrode 120 does not overlap the first supporting field insulating layer 105b in the third direction D3, and the gate insulating layer 130 may be between the first gate electrode 120 and the first lower field insulating layer 105a.

The gate insulating layer 130 may include silicon oxide, silicon oxynitride, silicon nitride, or a high-k material having a higher dielectric constant than silicon oxide. The high-k material may include, for example, at least one selected from the group consisting of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, without limitation.

The semiconductor device according to some embodiments may include a negative capacitor (NC) FET using a negative capacitor (NC). For example, the gate insulating layer 130 may include a ferroelectric material layer having ferroelectric properties and a paraelectric material layer having paraelectric properties.

The ferroelectric material layer may have a negative capacitance, and the paraelectric material layer may have a positive capacitance. When two or more capacitors are connected in series and have a positive capacitance, the total capacitance is smaller than the capacitance of each individual capacitor. On the other hand, when at least one of two or more capacitors connected in series has a negative capacitance, the total capacitance may have a positive value greater than the absolute value of each individual capacitance.

When a ferroelectric material layer having a negative capacitance and a paraelectric material layer having a positive capacitance are connected in series, the total capacitance value of the ferroelectric material layer and the paraelectric material layer connected in series may be increased. By using the principle that the total capacitance value is increased, a transistor containing the ferroelectric material layer may have a subthreshold swing (SS) lower than or equal to a threshold voltage lower than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, or lead zirconium titanium oxide, without limitation. Here, in one example, hafnium zirconium oxide may be a material obtained by doping hafnium oxide with zirconium (Zr). In another example, hafnium zirconium oxide may be a compound of hafnium (Hf), zirconium (Zr), and oxygen (O).

The ferroelectric material layer may further include a dopant doped thereinto. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn), without limitation. The type of the dopant contained in the ferroelectric material layer may vary depending on the type of the ferroelectric material contained in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y), without limitation.

When the dopant is aluminum (Al), the ferroelectric material layer may can contain 3 to 8 at % (atomic %) aluminum. Here, the ratio of the dopant may be the ratio of aluminum to the sum of hafnium and aluminum.

When the dopant is silicon (Si), the ferroelectric material layer may contain 2 to 10 at % silicon. When the dopant is yttrium (Y), the ferroelectric material layer may contain 2 to 10 at % yttrium. When the dopant is gadolinium (Gd), the ferroelectric material layer may contain 1 to 7 at % gadolinium. When the dopant is zirconium (Zr), the ferroelectric material layer may contain 50 to 80 at % zirconium.

The paraelectric material layer may have paraelectric properties. The paraelectric material layer may contain, as examples, at least one of silicon oxide and metal oxide having a high dielectric constant. The metal oxide included in the paraelectric material layer may include, for example, at least one of hafnium oxide, zirconium oxide, or aluminum oxide, but the present disclosure is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide contained in the ferroelectric material layer may be different from the crystal structure of the hafnium oxide contained in the paraelectric material layer.

The ferroelectric material layer may have a thickness that exhibits ferroelectric properties. The thickness of the ferroelectric material layer may be, e.g., 0.5 nanometers (nm) to 10 nm, but the present disclosure is not limited thereto. Since the ferroelectric materials may have different critical thicknesses that exhibit the ferroelectric properties, the thickness of the ferroelectric material layer may vary depending on the ferroelectric materials.

In some embodiments, the gate insulating layer 130 may include one ferroelectric material layer. In some embodiments, the gate insulating layer 130 may include a plurality of ferroelectric material layers spaced apart from each other. The gate insulating layer 130 may have a laminated layer structure in which a plurality of ferroelectric material layers and a plurality of paraelectric material layers are alternately laminated.

A gate capping pattern 145 may be on the top surface of the first gate electrode 120 and the top surface of the gate spacer 140. The gate capping pattern 145 may include, for example, at least one of silicon nitride (SiN), silicon oxynitride (SiON), silicon oxide (SiO2), silicon carbonitride (SiCN), silicon oxycarbonitride (SiOCN), or a combination thereof. In some embodiments, and differing from what is shown in the illustrated example, the gate capping pattern 145 may be between the gate spacers 140. In this case, the top surface of the gate capping pattern 145 may lie on the same plane as the top surface of the gate spacer 140.

The first epitaxial pattern 150 may be on the first fin-shaped pattern 110. The first epitaxial pattern 150 may be between the first gate electrodes 120 adjacent in the first direction D1. The first epitaxial pattern 150 may be connected to the first fin-shaped pattern 110. The first epitaxial pattern 150 may be in the first active region RX1.

The second epitaxial pattern 250 may be on the second fin-shaped pattern 210. The second epitaxial pattern 250 may be between the first gate electrodes 120 adjacent in the first direction D1. The second epitaxial pattern 250 may be connected to the second fin-shaped pattern 210. The second epitaxial pattern 250 may be in the second active region RX2. The second epitaxial pattern 250 is separated from the first epitaxial pattern 150 in the second direction D2. In other words, the second epitaxial pattern 250 may not be directly connected to the first epitaxial pattern 150.

Since the first epitaxial pattern 150 may be connected to the plurality of first fin-shaped patterns 110 and the second epitaxial pattern 250 may be connected to the plurality of second fin-shaped patterns 210, each of the first epitaxial pattern 150 and the second epitaxial pattern 250 may be a shared epitaxial pattern.

The first epitaxial pattern 150 and the second epitaxial pattern 250 may be included in the source/drain of the transistor using the first fin-shaped pattern 110 and the second fin-shaped pattern 210 as channel regions.

More specifically, the first epitaxial pattern 150 may include a bottom surface 150bs, a sidewall 150sw, and a connection surface 150cs. The first epitaxial pattern 150 may be connected to the first fin-shaped pattern 110 through the bottom surface 150bs of the first epitaxial pattern. The connection surface 150cs of the first epitaxial pattern 150 may connect the adjacent bottom surfaces 150bs of the first epitaxial pattern.

The sidewall 150sw of the first epitaxial pattern 150 may extend from the bottom surface 150bs of the first epitaxial pattern in the third direction D3. The sidewall 150sw of the first epitaxial pattern 150 may be directly connected to the bottom surface 150bs of the first epitaxial pattern 150. The sidewall 150sw of the first epitaxial pattern 150 may include a lower sidewall 150sw1, an upper sidewall 150sw2, and a facet intersection point 150FC.

The lower sidewall 150sw1 of the first epitaxial pattern 150 may be directly connected to the bottom surface 150bs of the first epitaxial pattern 150. The facet intersection point 150FC of the first epitaxial pattern 150 may be the point where the lower sidewall 150sw1 of the first epitaxial pattern and the upper sidewall 150sw2 of the first epitaxial pattern meet.

Between the lower sidewalls 150sw1 of the first epitaxial pattern 150, the width of the first epitaxial pattern 150 in the second direction D2 may increase as the distance from the substrate 100 increases. Between the upper sidewalls 150sw2 of the first epitaxial pattern 150, the width of the first epitaxial pattern 150 in the second direction D2 may decrease as the distance from the substrate 100 increases. The facet intersection point 150FC of the first epitaxial pattern 150 may be the point where the width of the first epitaxial pattern 150 in the second direction D2 that has increased starts to decrease as the distance from the substrate 100 increases. Stated differently, the facet interconnection point 150FC may be on a sidewall of the first epitaxial pattern 150 at a maximum width of the first epitaxial pattern 150 in the second direction D2.

In some embodiments, an air gap may exist in the space between the first lower field insulating layer 105a and the connection surface 150cs of the first epitaxial pattern 150. In some embodiments, the space between the first lower field insulating layer 105a and the connection surface 150cs of the first epitaxial pattern 150 may be filled with an insulating material.

The second epitaxial pattern 250 may include a bottom surface 250bs, a sidewall 250sw, and a connection surface 250cs. The second epitaxial pattern 250 may be connected to the second fin-shaped pattern 210 through the bottom surface 250bs of the second epitaxial pattern. The connection surface 250cs of the second epitaxial pattern 250 may connect the adjacent bottom surfaces 250bs of the second epitaxial pattern 250.

The sidewall 250sw of the second epitaxial pattern 250 may extend from the bottom surface 250bs of the second epitaxial pattern 250 in the third direction D3. The sidewall 250sw of the second epitaxial pattern 250 may be directly connected to the bottom surface 250bs of the second epitaxial pattern 250. The sidewall 250sw of the second epitaxial pattern may include a lower sidewall 250sw1, an upper sidewall 250sw2, and a facet intersection point 250FC.

The lower sidewall 250sw1 of the second epitaxial pattern 250 may be directly connected to the bottom surface 250bs of the second epitaxial pattern 250. The facet intersection point 250FC of the second epitaxial pattern 250 may be the point where the lower sidewall 250sw1 of the second epitaxial pattern and the upper sidewall 150sw2 of the second epitaxial pattern meet.

Between the lower sidewalls 250sw1 of the second epitaxial pattern 250, the width of the second epitaxial pattern 250 in the second direction D2 may increase as the distance from the substrate 100 increases. Between the upper sidewalls 250sw2 of the second epitaxial pattern 250, the width of the second epitaxial pattern 250 in the second direction D2 may decrease as the distance from the substrate 100 increases. The facet intersection point 250FC of the second epitaxial pattern 250 may be the point where the width of the second epitaxial pattern 250 in the second direction D2 that has increased starts to decrease as the distance from the substrate 100 increases. Stated differently, the facet interconnection point 250FC may be on a sidewall of the second epitaxial pattern 250 at a maximum width of the second epitaxial pattern 250 in the second direction D2.

In some embodiments, an air gap may exist in the space between the first lower field insulating layer 105a and the connection surface 250cs of the second epitaxial pattern 250. In some embodiments, the space between the first lower field insulating layer 105a and the connection surface 250cs of the second epitaxial pattern 250 may be filled with an insulating material.

In FIG. 2, the first field insulating layer 105 may cover the sidewall of the first fin-shaped pattern 110, the sidewall of the second fin-shaped pattern 210, a part of the sidewall 150sw of the first epitaxial pattern 150, and a part of the sidewall 250sw of the second epitaxial pattern 250. In the semiconductor device according to some embodiments, the first field insulating layer 105 may cover at least a part of the lower sidewall 150sw1 of the first epitaxial pattern 150 and at least a part of the lower sidewall 250sw1 of the second epitaxial pattern 250. The first field insulating layer 105 may not cover the upper sidewall 150sw2 of the first epitaxial pattern 150 and the upper sidewall 250sw2 of the second epitaxial pattern 259.

The first supporting field insulating layer 105b may cover a part of the sidewall 150sw of the first epitaxial pattern 150 and a part of the sidewall 250sw of the second epitaxial pattern 250. The first supporting field insulating layer 105b may cover at least a part of the lower sidewall 150sw1 of the first epitaxial pattern 150 and at least a part of the lower sidewall 250sw1 of the second epitaxial pattern 250. However, the first lower field insulating layer 105a may not cover the lower sidewall 150sw1 of the first epitaxial pattern 150 and the lower sidewall 250sw1 of the second epitaxial pattern 250.

For example, with respect to the top surface of the substrate 100, the top surface 105us of the first field insulating layer 105 may be higher than the bottom surface 150bs of the first epitaxial pattern 150 and the bottom surface 250bs of the second epitaxial pattern 250. More specifically, the top surface 105us of the first field insulating layer between the first epitaxial pattern 150 and the second epitaxial pattern 250 may be higher than the bottom surface 150bs of the first epitaxial pattern 150 and the bottom surface 250bs of the second epitaxial pattern 250. Here, the top surface of the substrate 100 may be the bottom surface of the deep trench DT.

In the semiconductor device according to some embodiments, the top surface 105us of the first field insulating layer 105 may be lower than or at the same level as the facet intersection point 150FC of the first epitaxial pattern 150 and the facet intersection point 250FC of the second epitaxial pattern 250.

For example, the top surface 105us of the first field insulating layer 150 between the first epitaxial pattern 150 and the second epitaxial pattern 250 may have a concave shape.

In the semiconductor device according to some embodiments, the height H11 from the bottom surface of the fin trench FT to the bottom surface 150bs of the first epitaxial pattern 150 may be greater than a height H12 from the bottom surface of the fin trench FT to the bottom surface 250bs of the second epitaxial pattern 250.

The height from the bottom surface of the fin trench FT to the facet intersection point 150FC of the first epitaxial pattern 150 may be different from the height from the bottom surface of the fin trench FT to the facet intersection point 250FC of the second epitaxial pattern 250. For example, the height from the bottom surface of the fin trench FT to the facet intersection point 150FC of the first epitaxial pattern 150 may be greater than the height from the bottom surface of the fin trench FT to the facet intersection point 250FC of the second epitaxial pattern 250.

The first etch stop layer 195 may extend along the top surface of the first field insulating layer 105, the sidewall 150sw of the first epitaxial pattern 150, and the sidewall 250sw of the second epitaxial pattern 250. The first etch stop layer 195 may be in contact with the first field insulating layer 105. For example, the first etch stop layer 195 may be in contact with the top surface 105us of the first field insulating layer 105.

Since the top surface 105us of the first field insulating layer 105 is higher than the bottom surface 150bs of the first epitaxial pattern 150 and the bottom surface 250bs of the second epitaxial pattern 250 with respect to the top surface of the substrate 100, the first etch stop layer 195 may be formed higher than the bottom surface 150bs of the first epitaxial pattern 150 and the bottom surface 250bs of the second epitaxial pattern 250.

When the first field insulating layer 105 covers a part of the lower sidewall 150sw1 of the first epitaxial pattern 150 and a part of the lower sidewall 250sw1 of the second epitaxial pattern 250, the first etch stop layer 195 may extend along a part of the lower sidewall 150sw1 of the first epitaxial pattern 150 and a part of the lower sidewall 250sw1 of the second epitaxial pattern 250.

The first etch stop layer 195 may include a connection part 195cp that extends along the top surface 105us of the first field insulating layer 105 between the first epitaxial pattern 150 and the second epitaxial pattern 250. The connection part 195cp of the first etch stop layer 195 may be between the first epitaxial pattern 150 and the second epitaxial pattern 250. When the first field insulating layer 105 covers a part of the lower sidewall 150sw1 of the first epitaxial pattern 150 and a part of the lower sidewall 250sw1 of the second epitaxial pattern 250, the first etch stop layer 195 between the first epitaxial pattern 150 and the second epitaxial pattern 250 may include a portion that extends along the sidewall 150sw of the first epitaxial pattern 150 and the sidewall 250sw of the second epitaxial pattern 250, and a portion that extends along the sidewall of the gate spacer 140. In the following description, the connection part 195cp of the first etch stop layer 195 may refer only to a portion in contact with the top surface 105us of the first field insulating layer 105 except the portion extending along the sidewall 150sw of the first epitaxial pattern 150 and the sidewall 250sw of the second epitaxial pattern 259 and the portion extending along the sidewall of the gate spacer 140.

The first etch stop layer 195 between the first epitaxial pattern 150 and the second epitaxial pattern 250 may include the connection part 195cp of the first etch stop layer 195 that extends along the top surface 105us of the first field insulating layer 105, a first extension portion that extends along the sidewall 150sw of the first epitaxial pattern 150, and a second extension portion that extends along the sidewall 250sw of the second epitaxial pattern 250. The connection part 195cp of the first etch stop layer 195 may be directly connected to the first extension portion and the second extension portion.

Figure 4:
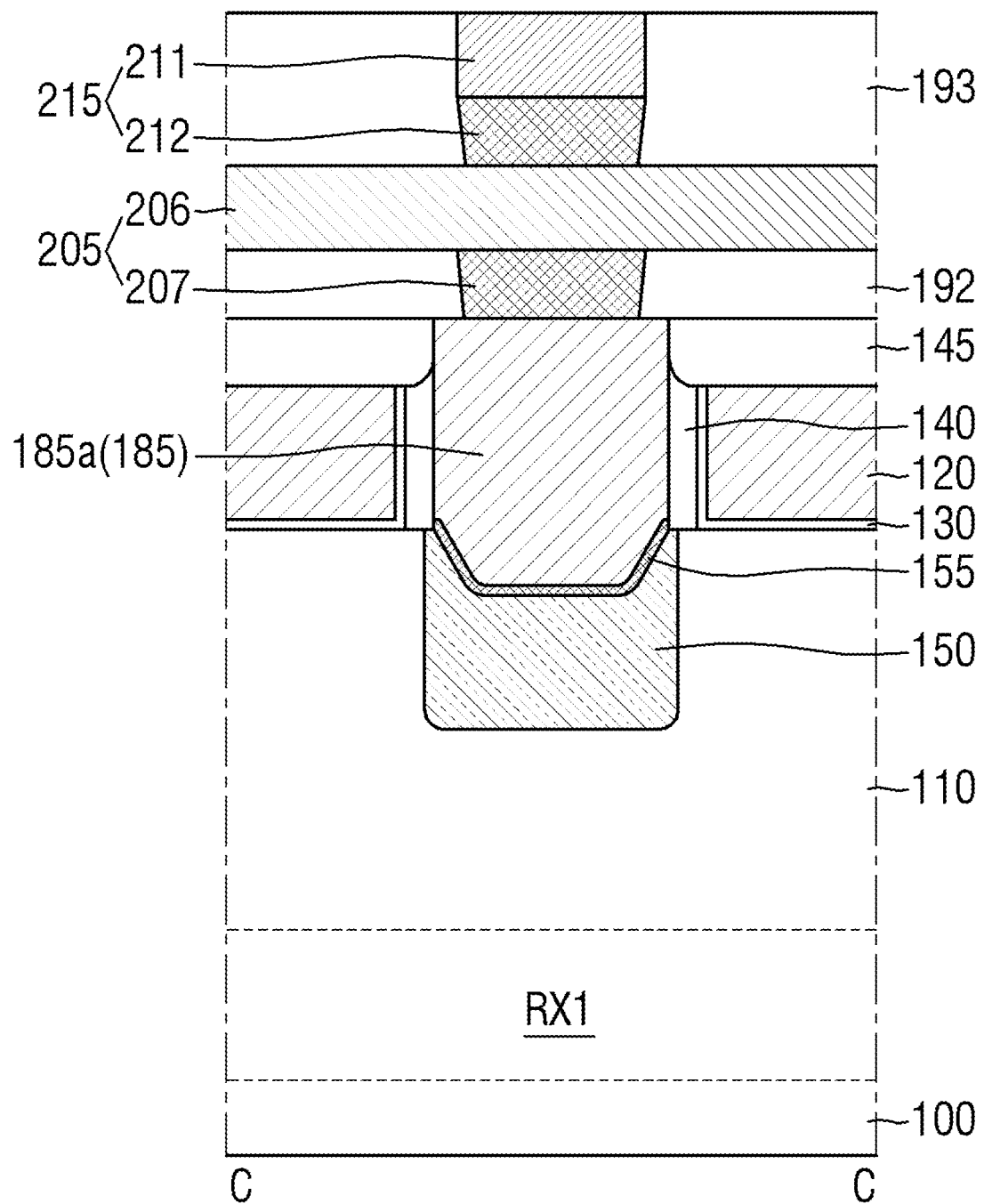
Figure 5:
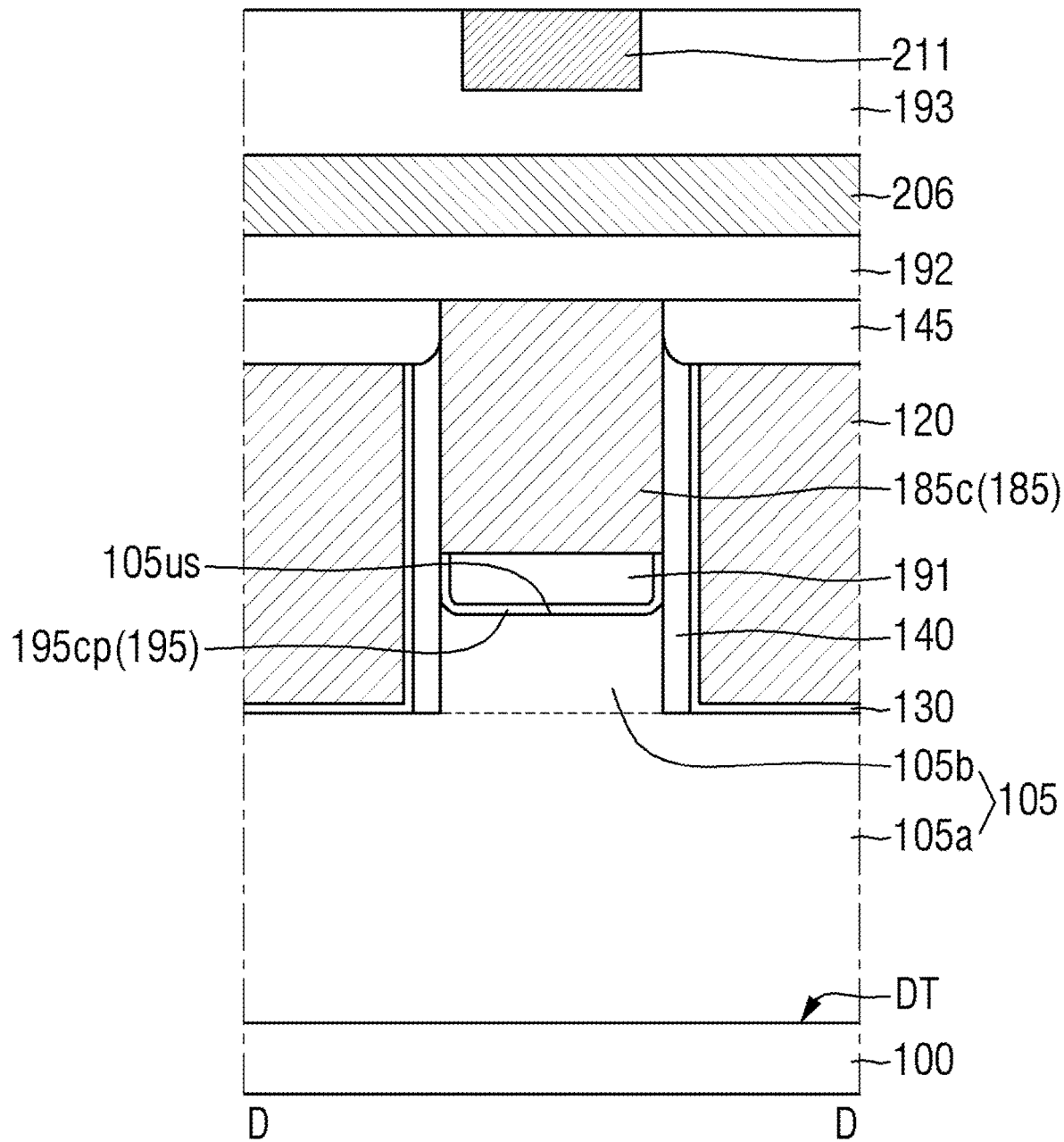

In FIG. 4, the top surface 105us of the first field insulating layer 105 between the first gate electrodes 120 may be higher than the bottom surface of the first gate electrode 120 with respect to the top surface of the substrate 100, and the first etch stop layer 195 extending along the top surface 105us of the first field insulating layer 105 may be higher than the bottom surface of the first gate electrode 120.

The first etch stop layer 195 may contain a material having an etching selectivity with respect to a first interlayer insulating layer 191 to be described later. The first etch stop layer 195 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), or a combination thereof, without being limited thereto.

The first interlayer insulating layer 191 may be on the first etch stop layer 195. The top surface of the first interlayer insulating layer 191 may lie on the same plane as the top surface of the gate capping pattern 145.

The first source/drain contact 185 may be on the first epitaxial pattern 150 and the second epitaxial pattern 250. A second source/drain contact 186 may be on one of the first epitaxial pattern 150 and the second epitaxial pattern 250. Alternatively, the first source/drain contact 185 may be connected to both the first epitaxial pattern 150 and the second epitaxial pattern 250 The second source/drain contact 186 may be connected to one of the first epitaxial pattern 150 and the second epitaxial pattern 250, and may not be connected to the other of the first epitaxial pattern 150 and the second epitaxial pattern 250. The following description will focus on the first source/drain contact 185.

A first silicide layer 155 may be formed between the first source/drain contact 185 and the first epitaxial pattern 150. A second silicide layer 255 may be formed between the first source/drain contact 185 and the second epitaxial pattern 250.

The first source/drain contact 185 may be formed across the first epitaxial pattern 150 and the second epitaxial pattern 250. For example, the first source/drain contact 185 may include a first portion 185a, a second portion 185b, and a connection portion 185c. The first portion 185a of the first source/drain contact may overlap the first epitaxial pattern 150 in the third direction D3 or in the vertical direction. The second portion 185b of the first source/drain contact may overlap the second epitaxial pattern 250 in the third direction D3 or in the vertical direction. The connection portion 185c of the first source/drain contact 185 may directly connect the first portion 185a of the first source/drain contact 185 to the second portion 185b of the first source/drain contact 185.

The connection portion 185c of the first source/drain contact 185 may not overlap the first epitaxial pattern 150 and the second epitaxial pattern 250 in the vertical direction.

The bottom surface of the connection portion 185c of the first source/drain contact 185 may be spaced apart from the connection part 195cp of the first etch stop layer 195 in the third direction D3. A part of the first interlayer insulating layer 191 may be between the connection portion 185c of the first source/drain contact 185 and the connection part 195cp of the first etch stop layer 195. The first etch stop layer 195 between the first epitaxial pattern 150 and the second epitaxial pattern 250 may be in contact with the connection portion 185c of the first source/drain contact 185, but the bottom surface of the connection portion 185c of the first source/drain contact 185 may not be in direct contact with the connection part 195cp of the first etch stop layer 195.

The top surface of the first source/drain contact 185 may lie on the same plane as the top surface of the first interlayer insulating layer 191. Further, the top surface of the first source/drain contact 185 may lie on the same plane as the top surface of the gate capping pattern 145.

Although it is illustrated that the bottom surfaces of the first portion 185a of the first source/drain contact and the second portion 185b of the first source/drain contact have a wavy shape, the present disclosure is not limited thereto.

In the semiconductor device according to some embodiments, a height (H12+H22) from the bottom surface of the fin trench FT to the second portion 185b of the first source/drain contact 185 at a portion overlapping the second fin-shaped pattern 210 may be greater than a height (H11+H21) from the bottom portion of the fin trench FT to the bottom portion of the first portion 185a of the first source/drain contact 185 at a portion overlapping the first fin-shaped pattern 110.

Since the height H11 from the bottom surface of the fin trench FT to the bottom surface 150bs of the first epitaxial pattern 150 may be greater than the height H12 from the bottom surface of the fin trench FT to the bottom surface 250bs of the second epitaxial pattern 250, the height H22 from the bottom surface 250bs of the second epitaxial pattern 250 to the bottom surface of the second portion 185b of the first source/drain contact 185 at the portion overlapping the second fin-shaped pattern 210 may be greater than the height H21 from the bottom surface 150bs of the first epitaxial pattern 150 to the bottom surface of the first portion 185a of the first source/drain contact 185 at the portion overlapping the first fin-shaped pattern 110. For example, the height H21 from the bottom surface 150bs of the first epitaxial pattern 150 to the bottom surface of the first portion 185a of the first source/drain contact 185 may be measured at an intermediate point of the width of the bottom surface 150bs of the first epitaxial pattern 150 in the second direction D2.

Each of the first source/drain contact 185 and the second source/drain contact 186 may contain a conductive material, e.g., at least one of metal, metal nitride, metal carbonitride, a two-dimensional material (2D) material, or a conductive semiconductor material. Although it is illustrated that each of the first source/drain contact 185 and the second source/drain contact 186 is a single layer for simplicity of description, the present disclosure is not limited thereto. In some embodiments, the first source/drain contact 185 and the second source/drain contact 186 may include a contact barrier layer and a contact filling layer that fills the space defined by the contact barrier layer. In some embodiments, the first source/drain contact 185 and the second source/drain contact 186 may include only a contact filling layer, and may be without a contact barrier layer. The first silicide layer 155 and the second silicide layer 255 may contain, e.g., a metal silicide material.

A second interlayer insulating layer 192 may be on the first interlayer insulating layer 191. The second interlayer insulating layer 192 may be on the top surface of the first source/drain contact 185.

A first wiring structure 205 may be in the second interlayer insulating layer 192. The first wiring structure 205 may include first wiring lines 206 and first vias 207. The first wiring lines 206 may be disposed at a first metal level. The first wiring structure 205 may include a first of the first wiring lines 206 and a second of the first wiring lines 206 connected to the first source/drain contact 185. The first source/drain contact 185 may be connected to two first wiring lines 206 disposed at the first metal level. The first of the first wiring lines 206 and the second of the first wiring lines 206 may be connected to the first source/drain contact 185 through the first vias 207. The first wiring lines 206 and the first vias 207 may be formed by different manufacturing processes. The boundary between the first wiring lines 206 and the first vias 207 may be distinguishable. In some embodiments, and differing from the illustrated example, the first wiring lines 206 and the first vias 207 may have an integral structure. In that case, the boundary between the first wiring lines 206 and the first vias 207 may not be distinguishable.

Each of the first wiring lines 206 and the first vias 207 may contain a conductive material, e.g., at least one of metal, metal nitride, metal carbonitride, a two-dimensional material (2D) material, or a conductive semiconductor material.

The third interlayer insulating layer 193 may be on the second interlayer insulating layer 192. The third interlayer insulating layer 193 may be on the first wiring structure 205.

Each of the first interlayer insulating layer 191, the second interlayer insulating layer 192, and the third interlayer insulating layer 193 may include, for example, silicon oxide, silicon nitride, silicon oxynitride, flowable oxide (FOX), tonen silazene (TOSZ), undoped silicate glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), Xerogel, Aerogel, amorphous fluorinated carbon, organo silicate glass (OSG), parylene, bis-benzocyclobutene (BCB), SiLK, polyimide, a porous polymeric material, or a combination thereof, but the present disclosure is not limited thereto.

A second wiring structure 215 may be in the third interlayer insulating layer 193. The second wiring structure 215 may include a second wiring line 211 and second vias 212. The second wiring line 211 may be at a second metal level higher than the first metal level.

The second wiring structure 215 may include the second wiring line 211 that connects the first of the first wiring lines 206 and the second of the first wiring lines 206 to the first source/drain contact 185. The second wiring line 211 may be connected through the second vias 212 to the first of the first wiring lines 206 and the second of the first wiring lines 206 that are connected to the first source/drain contact 185. The second wiring line 211 and the second vias 212 may be formed by different manufacturing processes. The boundary between the second wiring line 211 and the second vias 212 may be distinguishable. In some embodiments, and differing from the illustrated example, the second wiring line 211 and the second vias 212 may have an integral structure. In that case, the boundary between the second wiring line 211 and the second vias 212 may not be distinguishable.

Each of the second wiring line 211 and the second vias 212 may contain a conductive material, e.g., at least one of metal, metal nitride, metal carbonitride, a two-dimensional material (2D) material, or a conductive semiconductor material.

Figure 6:
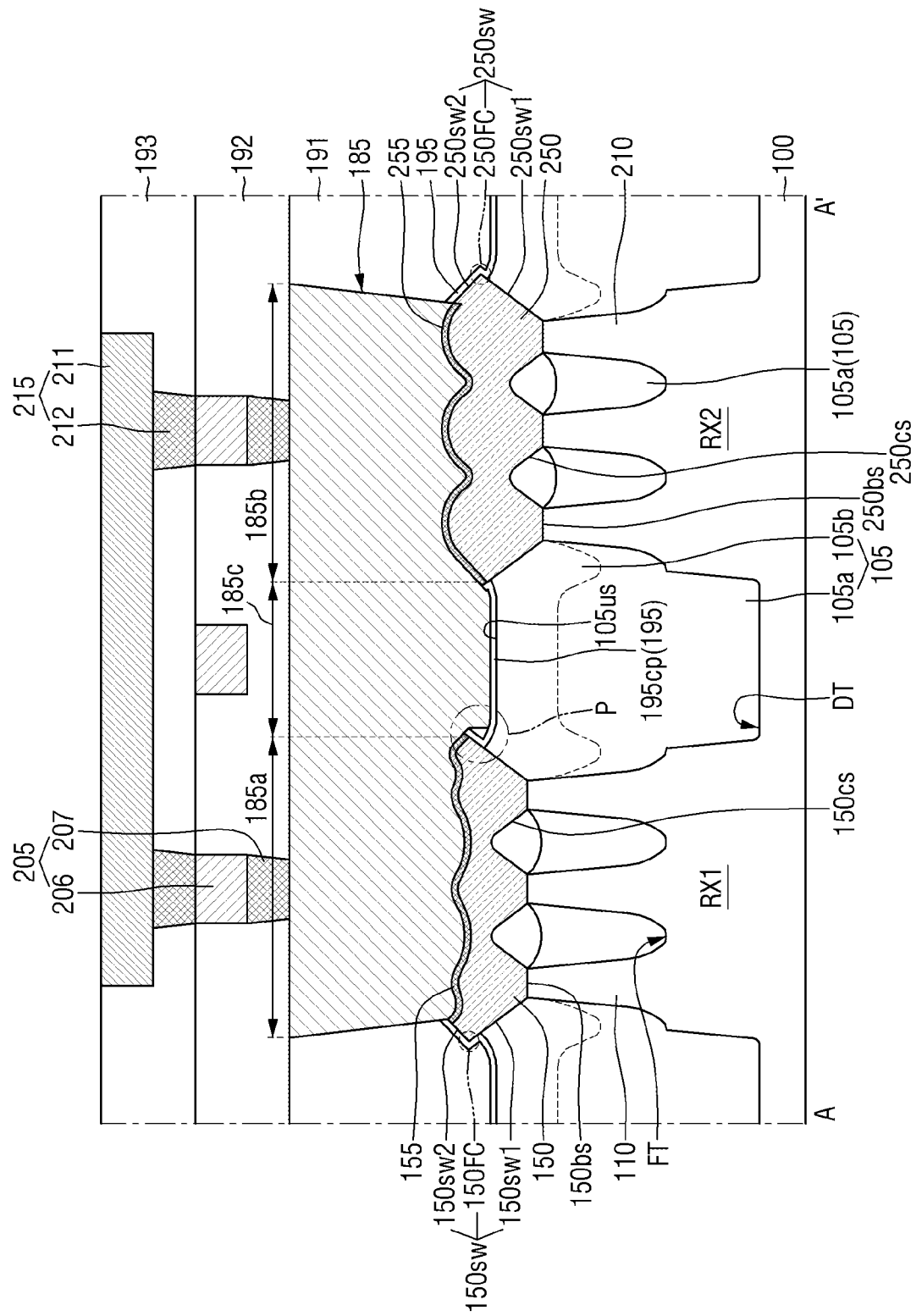
FIG. 6 is a diagram illustrating a semiconductor device according to some embodiments.
Figure 7:
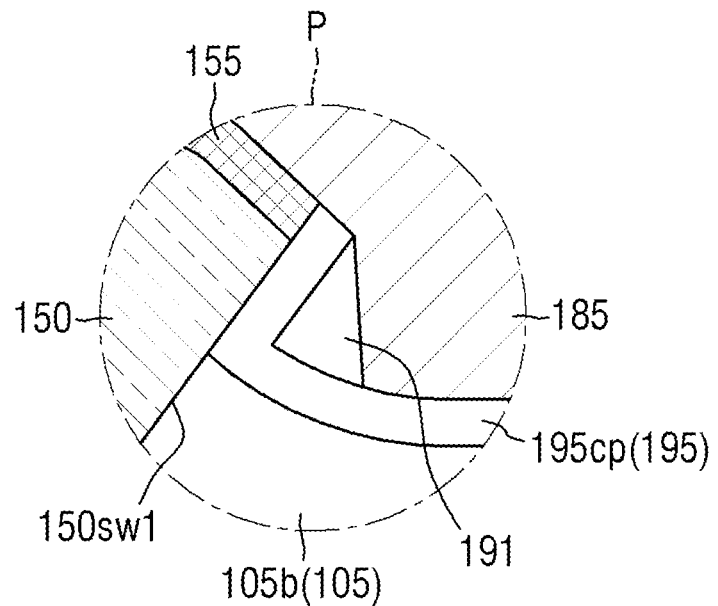
FIGS. 7 and 8 are exemplary enlarged views of area P of FIG. 6.
Figure 8:
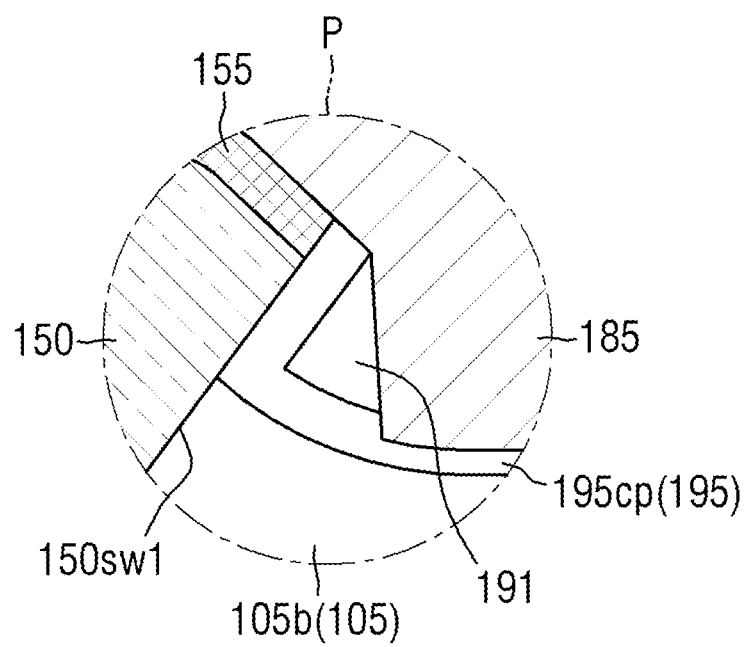

FIG. 6 is a diagram illustrating a semiconductor device according to some embodiments. FIGS. 7 and 8 are exemplary enlarged views of area P of FIG. 6. For simplicity of description, the following description will focus on differences from the description with reference to FIGS. 1 to 5.

Referring to FIGS. 6 to 8, in the semiconductor device according to some embodiments, the bottom surface of the connection portion 185c of the first source/drain contact 185 may be in contact with the connection part 195cp of the first etch stop layer 195.

The first interlayer insulating layer 191 may not be between the bottom surface of the connection portion 185c of the first source/drain contact 185 and the connection part 195cp of the first etch stop layer 195.

Since, however, the lower sidewall 150sw1 of the first epitaxial pattern 150 is an inclined surface, a part of the first interlayer insulating layer 191 may be between the connection portion 185c of the first source/drain contact 185 and the sidewall 150sw of the first epitaxial pattern 150.

In FIG. 7, the connection part 195cp of the first etch stop layer 195 may not be etched at the portion where the connection portion 185c of the first source/drain contact 185 and the connection part 195cp of the first etch stop layer 195 are in contact with each other. In other words, when the connection part 195cp of the first etch stop layer 195 includes a first region in contact with the connection portion 185c of the first source/drain contact 185 and a second region that is not in contact with the connection portion 185c of the first source/drain contact 185, no stepped portion may be formed between the first region of the connection part 195cp of the first etch stop layer 195 and the second region of the connection part 195cp of the first etch stop layer 195.

In FIG. 8, the connection part 195cp of the first etch stop layer 195 may be partially etched at the portion where the connection portion 185c of the first source/drain contact and the connection part 195cp of the first etch stop layer are in contact with each other. However, the connection portion 185c of the first source/drain contact 185 may not be in contact with the first field insulating layer 105. When the connection part 195cp of the first etch stop layer 195 includes a first region in contact with the connection portion 185c of the first source/drain contact 185 and a second region that is not in contact with the connection portion 185c of the first source/drain contact 185, a stepped portion may be formed between the first region of the connection part 195cp of the first etch stop layer 195 and the second region of the connection part 195cp of the first etch stop layer 195.

FIGS. 9 to 12 are diagrams each illustrating a semiconductor device according to some embodiments. For simplicity of description, the following description will focus on differences from the description with reference to FIGS. 1 to 5.

Figure 9:
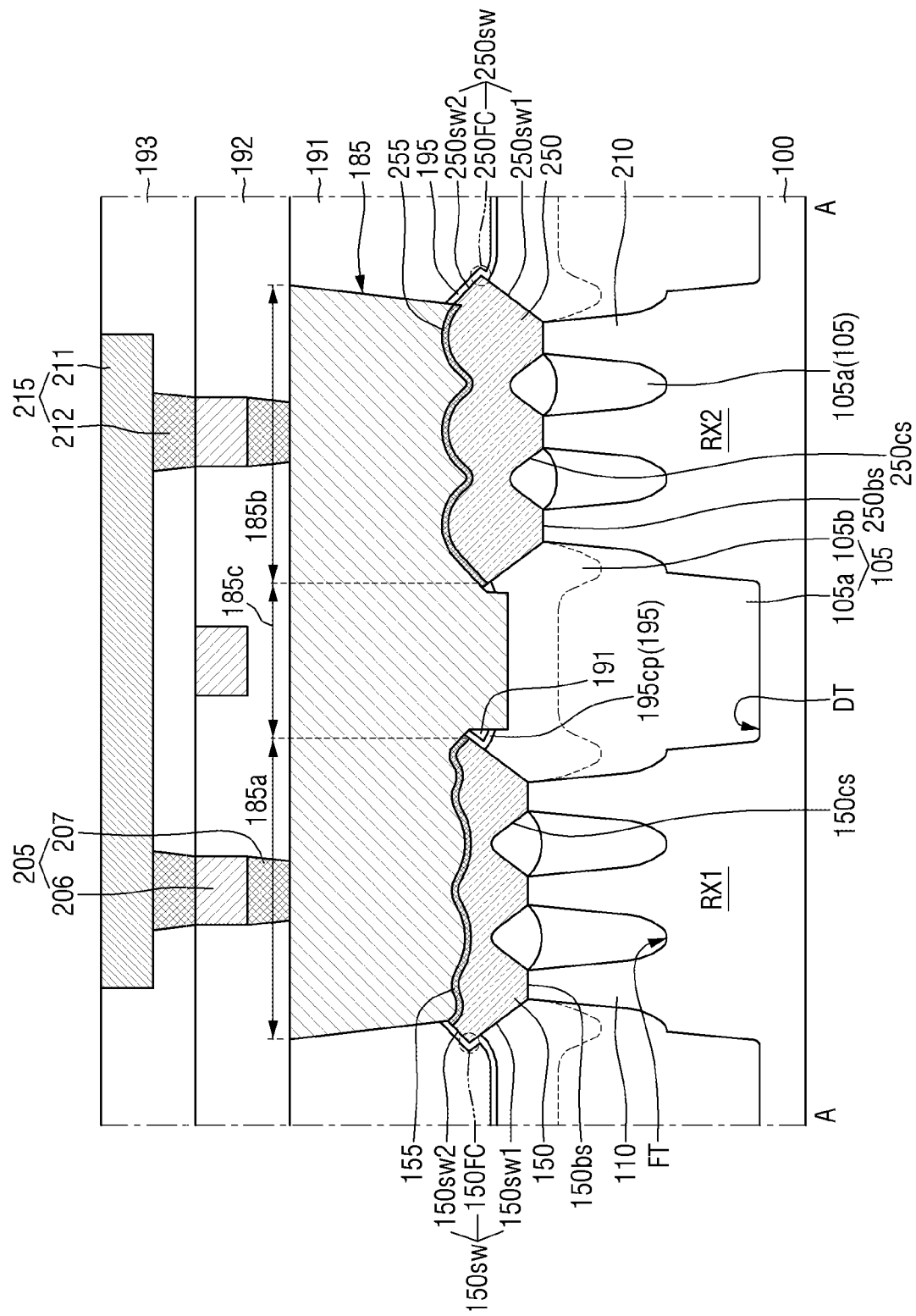
FIGS. 9 to 12 are diagrams each illustrating a semiconductor device according to some embodiments.

Referring to FIG. 9, in the semiconductor device according to some embodiments, the connection portion 185c of the first source/drain contact 185 may penetrate the connection part 195cp of the first etch stop layer 195.

The connection portion 185c of the first source/drain contact 185 may be in direct contact with the first field insulating layer 105. A part of the connection portion 185c of the first source/drain contact 185 may be inserted into the first field insulating layer 105.

Figure 10:
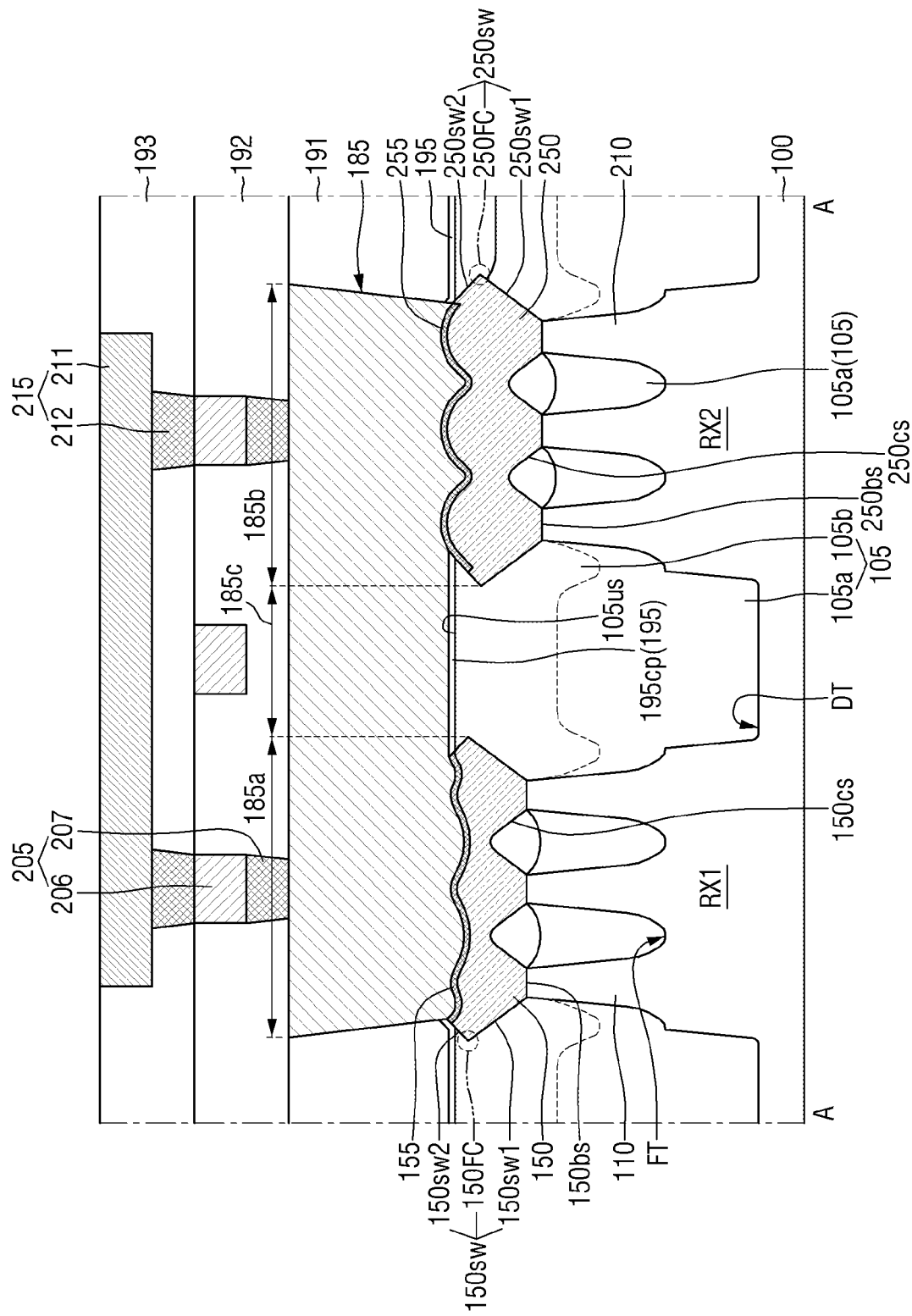

Referring to FIG. 10, in the semiconductor device according to some embodiments, the top surface 105us of the first field insulating layer 105 may be higher than the facet intersection point 150FC of the first epitaxial pattern 250 and/or the facet intersection point 250FC of the second epitaxial pattern 250.

In one example, the top surface 105us of the first field insulating layer 105 may be higher than the facet intersection point 150FC of the first epitaxial pattern 150 and the facet intersection point 250FC of the second epitaxial pattern 250. The first field insulating layer 105 may cover a part of the upper sidewall 150sw2 of the first epitaxial pattern 150 and a part of the upper sidewall 250sw2 of the second epitaxial pattern 250.

In another example, the top surface 105us of the first field insulating layer 105 may be higher than the facet intersection point 250FC of the second epitaxial pattern 250 and may be lower than or at the same level as the facet intersection point 150FC of the first epitaxial pattern 150. The first field insulating layer 105 may cover a part of the upper sidewall 250sw2 of the second epitaxial pattern 250.

Figure 11:
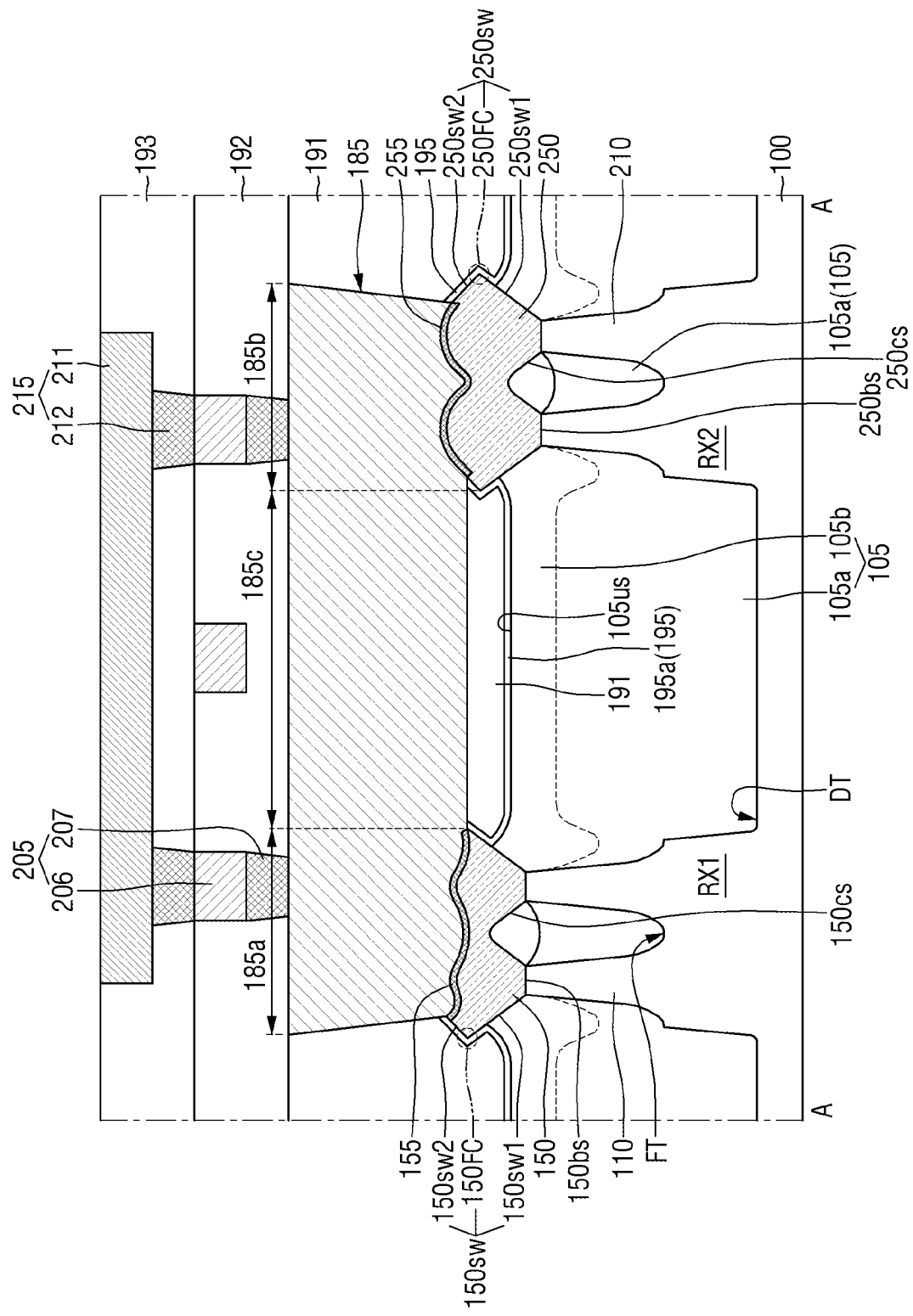

Referring to FIG. 11, in the semiconductor device according to some embodiments, two first fin-shaped patterns 110 may be in the first active region RX1, and two second fin-shaped patterns 210 may be in the second active region RX2.

The width of the deep trench DT that defines the first active region RX1 and the second active region RX2 may be greater than the width of the deep trench DT of FIG. 2. Accordingly, the distance between the first epitaxial pattern 150 and the second epitaxial pattern 250 that spaces the first epitaxial pattern 150 and the second epitaxial pattern 250 apart from each other in the second direction D2 (see FIG. 1) may be increased.

The top surface 105us of the first field insulating layer 105 between the first epitaxial pattern 150 and the second epitaxial pattern 250 may have a concave shape. With respect to the top surface of the substrate 100, the top surface 105us of the first field insulating layer 105 may be higher than the bottom surface 150bs of the first epitaxial pattern 150 and the bottom surface 250bs of the second epitaxial pattern 250. The top surface 105us of the first field insulating layer 105 may be lower than the facet intersection point 150FC of the first epitaxial pattern 150 and the facet intersection point 250FC of the second epitaxial pattern 250.

Figure 12:
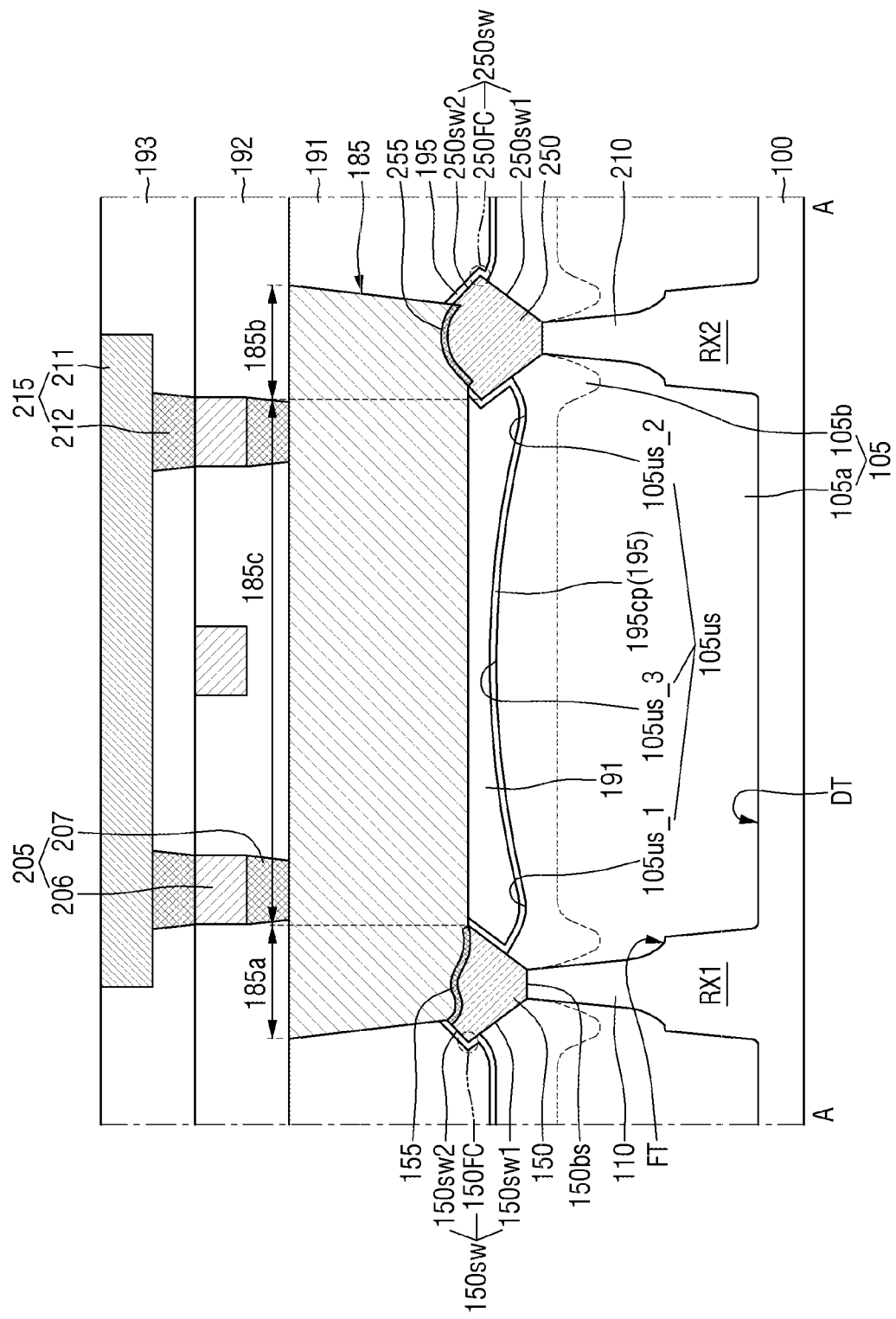

Referring to FIG. 12, in the semiconductor device according to some embodiments, one fin-shaped pattern 110 may be in the first active region RX1, and one fin-shaped pattern 210 may be in the second active region RX2.

The top surface 105us of the first field insulating layer 105 between the first epitaxial pattern 150 and the second epitaxial pattern 250 may have a W shape. For example, the top surface 105us of the first field insulating layer 105 between the first epitaxial pattern 150 and the second epitaxial pattern 250 may include a first portion 105us_1 and a second portion 105us_2 having a concave shape, and a third portion 105us_3 having a convex shape. The third portion 105us_3 of the top surface of the first field insulating layer 105 may be between the first portion 105us_1 of the top surface of the first field insulating layer 105 and the second portion 105us_2 of the top surface of the first field insulating layer 105.

With respect to the top surface of the substrate 100, the first portion 105us_1 of the top surface of the first field insulating layer 105 and the second portion 105us_2 of the top surface of the first field insulating layer 105 may be higher than the bottom surface 150bs of the first epitaxial pattern 150 and the bottom surface 250bs of the second epitaxial pattern 250. The first portion 105us_1 of the top surface of the first field insulating layer 105 and the second portion 105us_2 of the top surface of the first field insulating layer 105 are lower than the facet intersection point 150FC of the first epitaxial pattern 150 and the facet intersection point 250FC of the second epitaxial pattern 250.

In some embodiments, and differing from the illustrated example, in the semiconductor device described with reference to FIG. 11, the top surface 105us of the first field insulating layer 105 between the first epitaxial pattern 150 and the second epitaxial pattern 250 may have a W shape similar to that shown FIG. 12.

Figure 13:
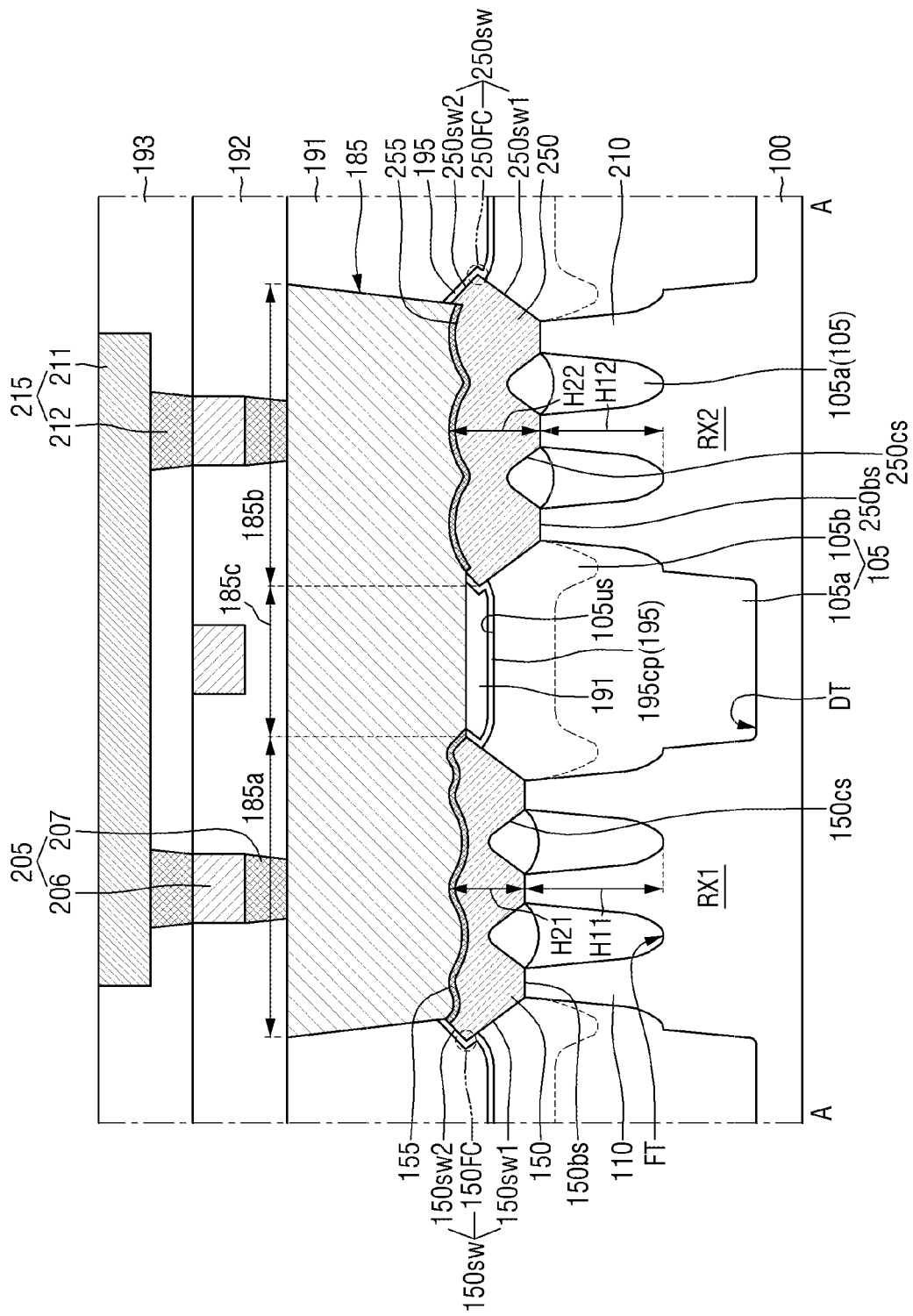
FIGS. 13 to 15 are diagrams each illustrating a semiconductor device according to some embodiments.
Figure 14:
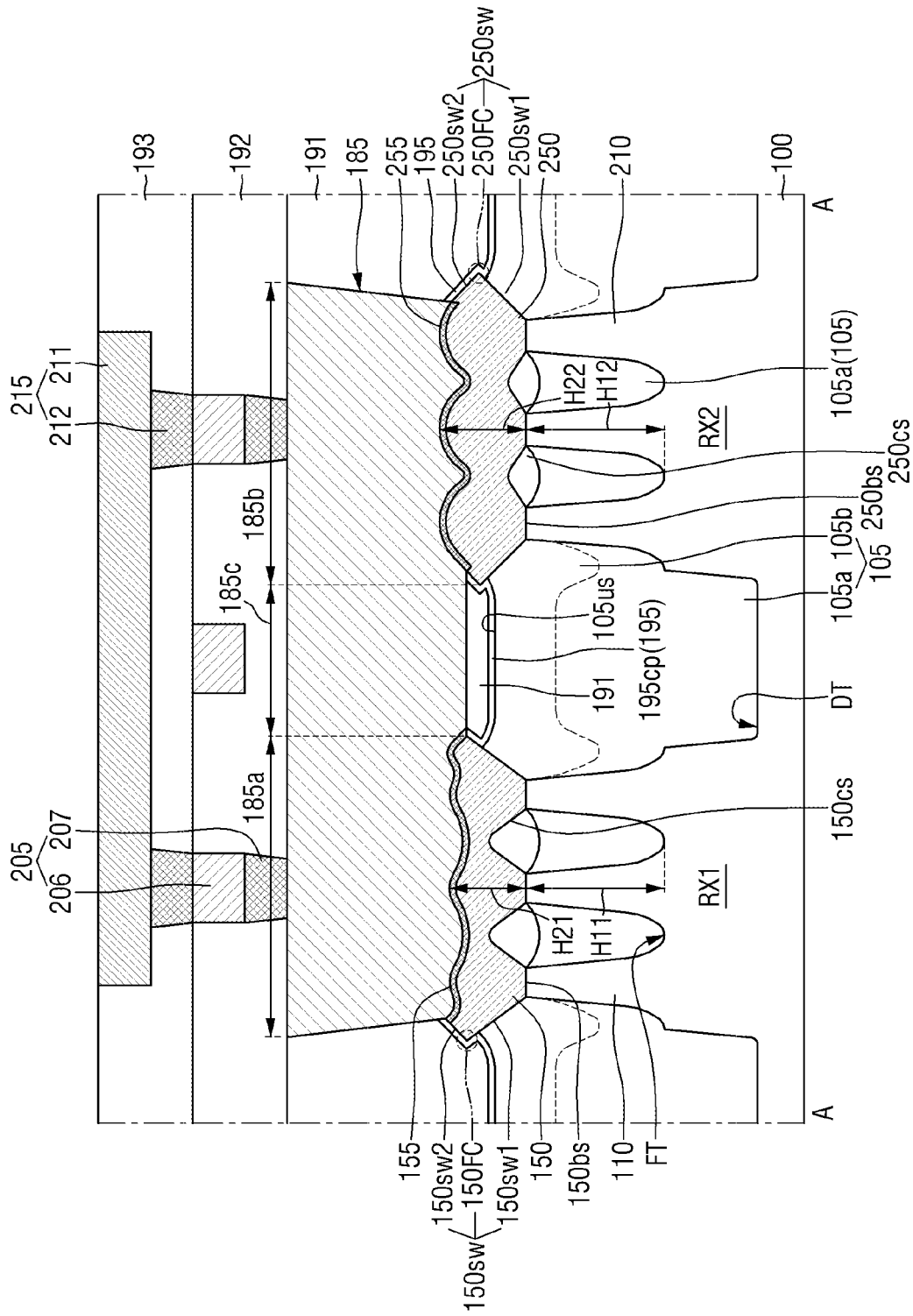
Figure 15:
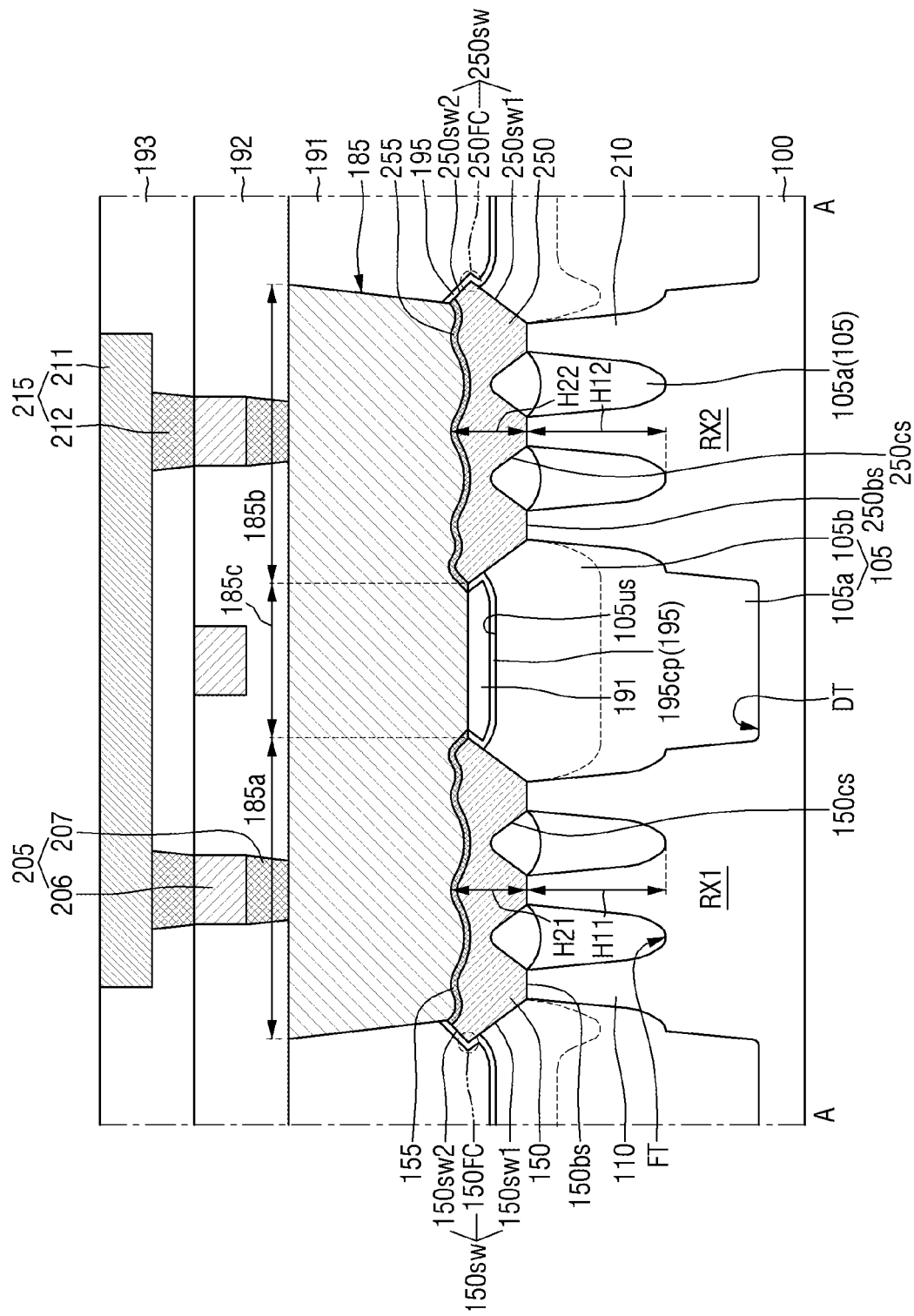

FIGS. 13 to 15 are diagrams each illustrating a semiconductor device according to some embodiments. For simplicity of description, the following description will focus on differences from the description with reference to FIGS. 1 to 5.

Referring to FIG. 13, in the semiconductor device according to some embodiments, the height (H12+H22) from the bottom surface of the fin trench FT to the second portion 185b of the first source/drain contact 185 at the portion overlapping the second fin-shaped pattern 210 may be the same as the height (H11+H21) from the bottom surface of the fin trench FT to the bottom surface of the first portion 185a of the first source/drain contact 185 at the portion overlapping the first fin-shaped pattern 110.

The height H11 from the bottom surface of the fin trench FT to the bottom surface 150bs of the first epitaxial pattern 150 may be greater than the height H12 from the bottom surface of the fin trench FT to the bottom surface 250bs of the second epitaxial pattern 250.

Referring to FIG. 14, in the semiconductor device according to some embodiments, the height H11 from the bottom surface of the fin trench FT to the bottom surface 150bs of the first epitaxial pattern 150 may be the same as the height H12 from the bottom surface of the fin trench FT to the bottom surface 250bs of the second epitaxial pattern 250.

The height (H12+H22) from the bottom surface of the fin trench FT to the bottom surface of the second portion 185b of the first source/drain contact 185 at the portion overlapping the second fin-shaped pattern 210 may be greater than the height (H11+H21) from the bottom surface of the fin trench FT to the bottom surface of the first portion 185a of the first source/drain contact 185 at the portion overlapping the first fin-shaped pattern 110.

The height H22 from the bottom surface 250bs of the second epitaxial pattern 250 to the bottom surface of the second portion 185b of the first source/drain contact 185 at the portion overlapping the second fin-shaped pattern 210 may be greater than the height H21 from the bottom surface 150bs of the first epitaxial pattern 150 to the bottom surface of the first portion 185a of the first source/drain contact 185 at the portion overlapping the first fin-shaped pattern 110.

Referring to FIG. 15, in the semiconductor device according to some embodiments, the first active region RX1 and the second active region RX2 may be regions where the same type of conductive transistors are formed. In some embodiments, the first active region RX1 and the second active region RX2 may be PMOS forming regions. In some embodiments, the first active region RX1 and the second active region RX2 may be NMOS forming regions.

The boundary between the first lower field insulating layer 105a and the first supporting field insulating layer 105b may have a concave shape. The height from the bottom surface of the fin trench FT to the facet intersection point 150FC of the first epitaxial pattern 150 may be the same as the height from the bottom surface of the fin trench FT to the facet intersection point 250FC of the second epitaxial pattern 250.

The height H11 from the bottom surface of the fin trench FT to the bottom surface 150bs of the first epitaxial pattern 150 may be the same as the height H12 from the bottom surface of the fin trench FT to the bottom surface 250bs of the second epitaxial pattern 250.

The height (H12+H22) from the bottom surface of the fin trench FT to the bottom surface of the second portion 185b of the first source/drain contact 185 at the portion overlapping the second fin-shaped pattern 210 may be the same as the height (H11+H21) from the bottom surface of the fin trench FT to the bottom surface of the first portion 185a of the first source/drain contact 185 at the portion overlapping the first fin-shaped pattern 110.

Figure 16:
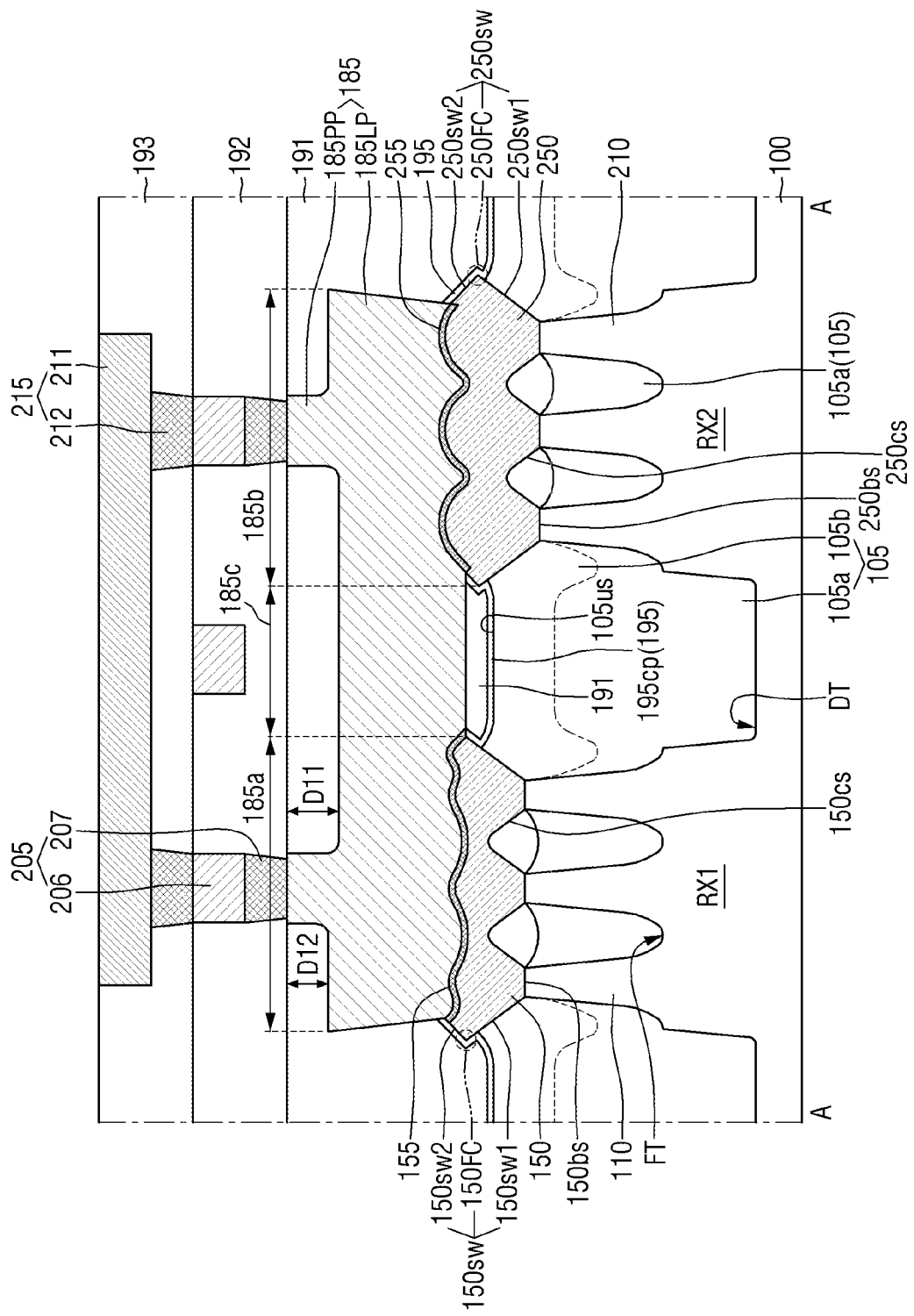
FIGS. 16 and 17 are diagrams each illustrating a semiconductor device according to some embodiments.
Figure 17:
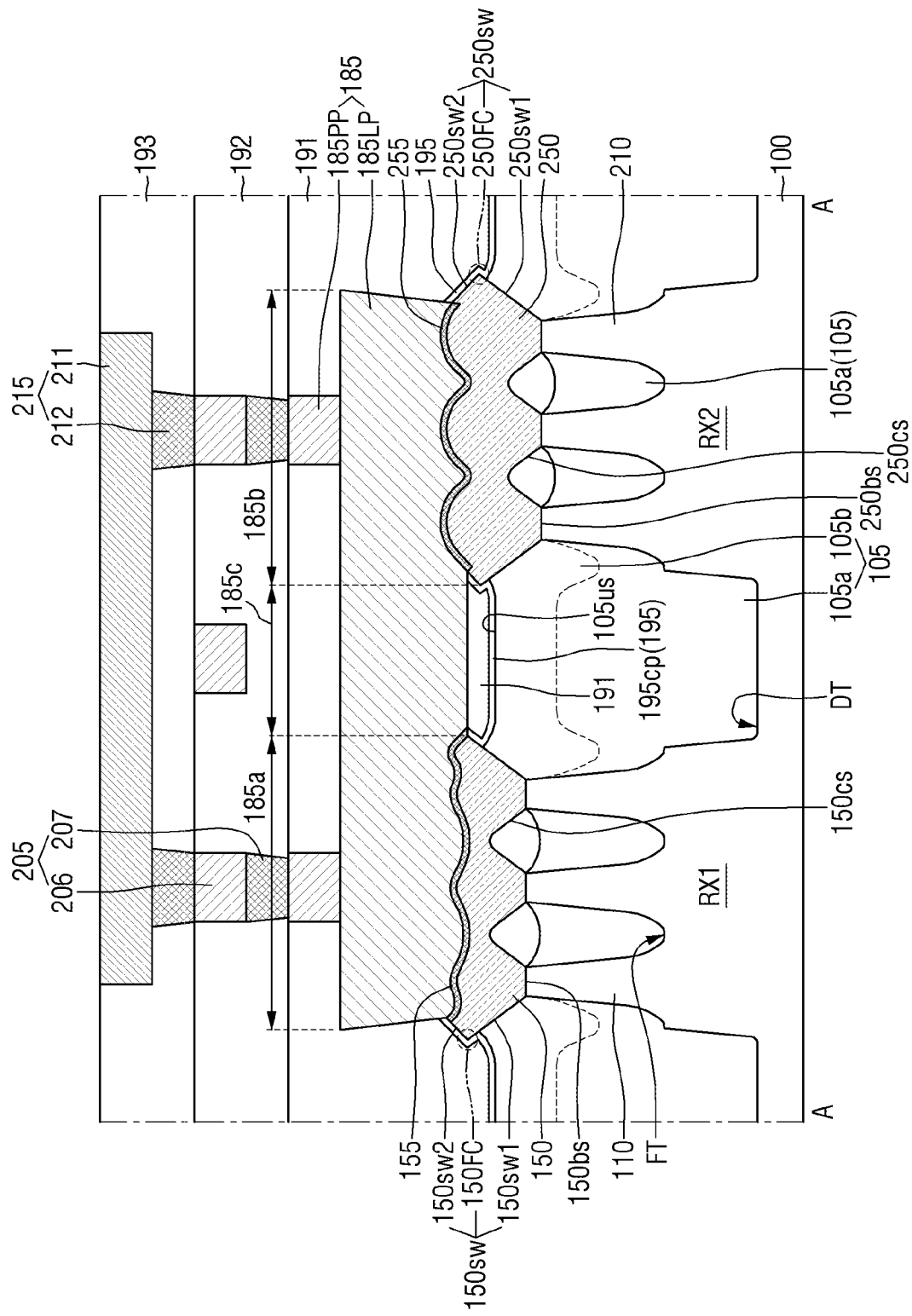

FIGS. 16 and 17 are diagrams each illustrating a semiconductor device according to some embodiments. For simplicity of description, the following description will focus on differences from the description with reference to FIGS. 1 to 5.

Referring to FIGS. 16 and 17, in the semiconductor device according to some embodiments, the first source/drain contact 185 may have a line portion 185LP and a protruding portion 185PP.

The line portion 185LP of the first source/drain contact 185 may be elongated in the second direction D2. The line portion 185LP of the first source/drain contact 185 may be a portion connecting the first epitaxial pattern 150 to the second epitaxial pattern 250.

The top surface of the line portion 185LP of the first source/drain contact 185 may be lower than the top surface of the first interlayer insulating layer 191. In other words, the top surface of the line portion 185LP of the first source/drain contact 185 may be lower than the top surface of the gate capping pattern 145 (see FIG. 5).

The protruding portion 185PP of the first source/drain contact 185 may protrude from the line portion 185LP of the first source/drain contact 185. The protruding portion 185PP of the first source/drain contact 185 may be a portion connected to the first wiring structure 205.

The top surface of the protruding portion 185PP of the first source/drain contact 185 may lie on the same plane as the top surface of the first interlayer insulating layer 191. The top surface of the protruding portion 185PP of the first source/drain contact 185 may lie on the same plane as the top surface of the gate capping pattern 145 (see FIG. 5).

The first source/drain contact 185 may have a first protruding portion 185PP and a second protruding portion 185PP connected to the first of the first wiring lines 206 and the second of the first wiring lines 206, respectively.

In FIG. 16, the line portion 185LP of the first source/drain contact 185 may have an integral structure with the first protruding portion 185PP of the first source/drain contact 185 and the second protruding portion 185PP of the first source/drain contact 185. In the manufacturing process, after the pre-structure of the first source/drain contact 185 is formed, a part of the pre-structure may be removed. The top surface of the pre-structure of the first source/drain contact 185 may lie on the same plane as the top surface of the first interlayer insulating layer 191. Accordingly, the protruding portion 185PP of the first source/drain contact 185 and the line portion 185LP of the first source/drain contact 185 may be formed.

The protruding portion 185PP of the first source/drain contact 185 may include a first sidewall and a second sidewall opposite to each other in the second direction D2. For example, with respect to the top surface of the protruding portion 185PP of the first source/drain contact 185, a depth D11 of the first sidewall of the protruding portion 185PP of the first source/drain contact 185 may be greater than a depth D12 of the second sidewall of the protruding portion 185PP of the first source/drain contact 185.

As the length of the line portion 185LP of the first source/drain contact 185 adjacent to the first sidewall of the protruding portion 185PP of the first source/drain contact 185 increases, the depth D11 of the first sidewall of the protruding portion 185PP of the drain contact 185 may increase. Further, as the length of the line portion 185LP of the first source/drain contact 185 adjacent to the second sidewall of the protruding portion 185PP of the first source/drain contact 185 decreases, the depth D12 of the second sidewall of the protruding portion 185PP of the first source/drain contact 185 may decrease.

In some embodiments, and differing from the illustrated example, the depth D11 of the first sidewall of the protruding portion 185PP of the first source/drain contact 185 may be the same as the depth D12 of the second sidewall of the protruding portion 185PP of the first source/drain contact 185. In some embodiments, the depth D11 of the first sidewall of the protruding portion 185PP of the first source/drain contact 185 may be smaller than the depth D12 of the second sidewall of the protruding portion 185PP of the first source/drain contact 185.

In FIG. 17, the line portion 185LP of the first source/drain contact 185 may have a structure different from those of the first protruding portion 185PP of the first source/drain contact 185 and the second protruding portion 185PP of the first source/drain contact 185. In the manufacturing process, after the pre-structure of the first source/drain contact 185 is formed, the pre-structure may be entirely etched to lower the top surface of the pre-structure. Accordingly, the line portion 185LP of the first source/drain contact 185 may be formed. Then, the first protruding portion 185PP of the first source/drain contact 185 and the second protruding portion 185PP of the first source/drain contact 185 may be formed on the line portion 185LP of the first source/drain contact 185.

Figure 18:
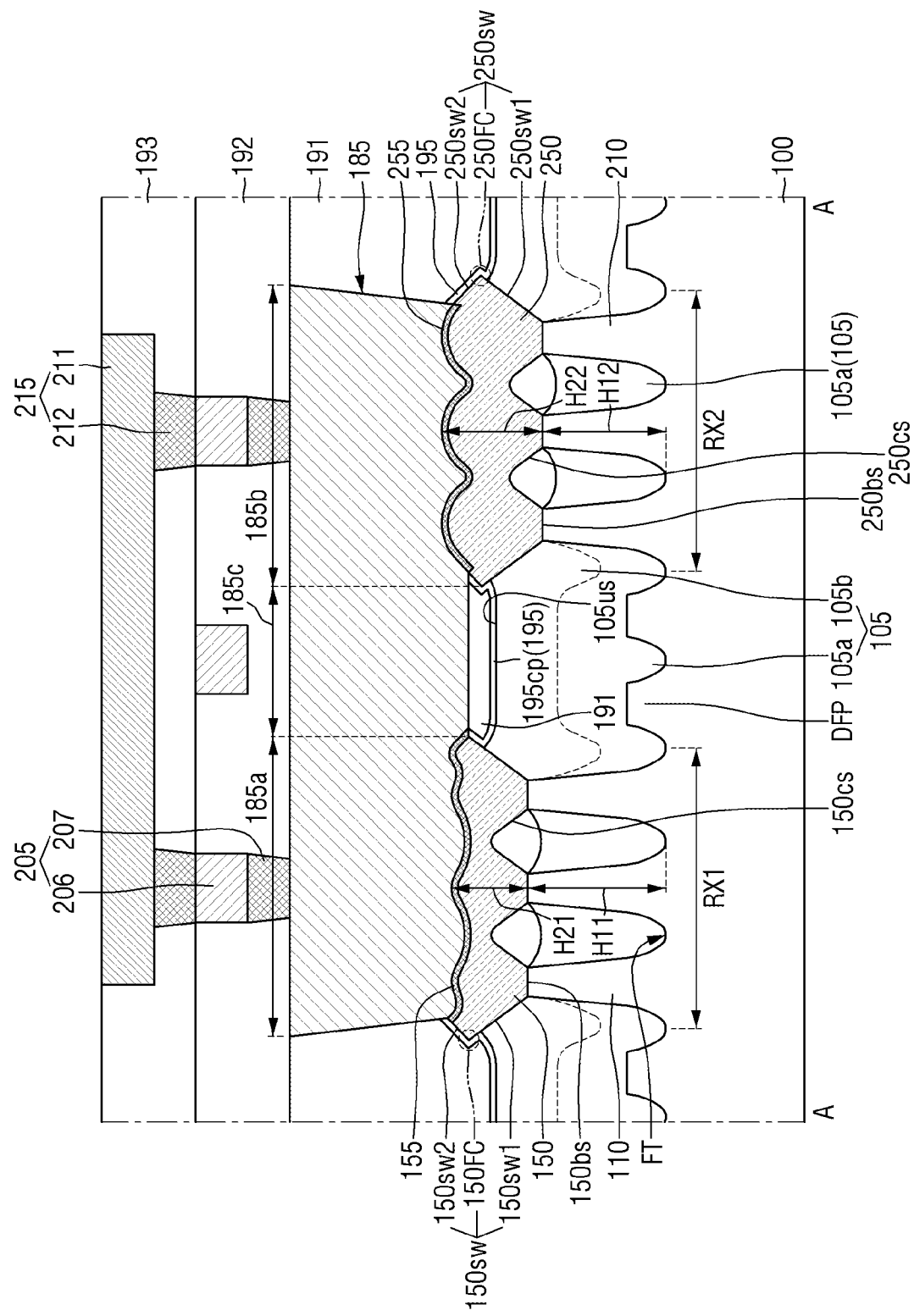
FIGS. 18 and 19 are diagrams each illustrating a semiconductor device according to some embodiments.
Figure 19:
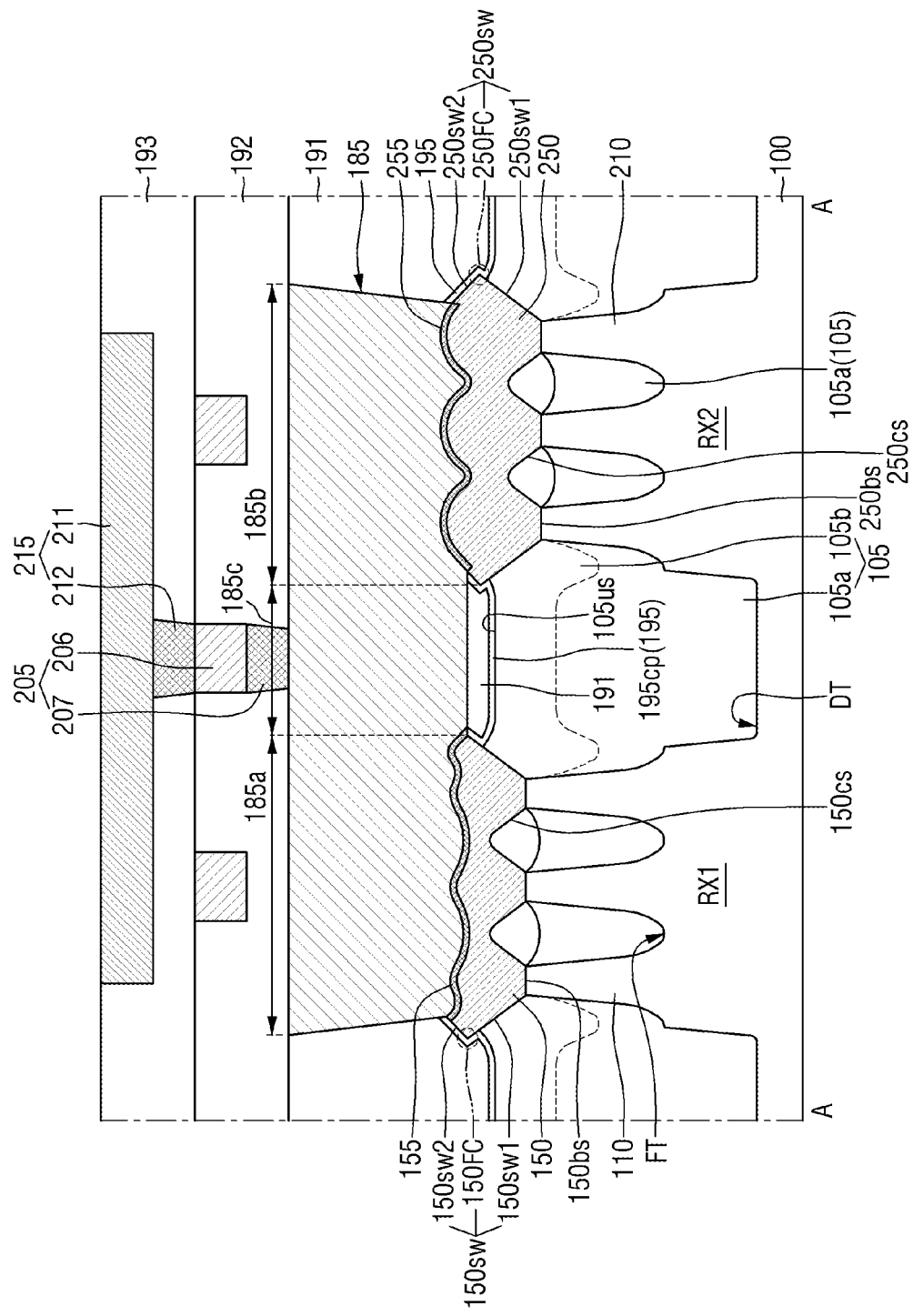

FIGS. 18 and 19 are diagrams each illustrating a semiconductor device according to some embodiments. For simplicity of description, the following description will focus on differences from the description with reference to FIGS. 1 to 5.

Referring to FIG. 18, in the semiconductor device according to some embodiments, the first active region RX1 and the second active region RX2 may be defined by a dummy fin pattern DFP.

In some embodiments, the first active region RX1 and the second active region RX2 may be defined between the dummy fin patterns DFP. The top surface of the dummy fin pattern DFP may be entirely covered by the first field insulating layer 105. The top surface of the dummy fin pattern DFP may be lower than the top surface 105us of the first field insulating layer 105. The dummy fin pattern DFP may contain the same material as those of the first fin-shaped pattern 110 and the second fin-shaped pattern 210, for example.

Referring to FIG. 19, in the semiconductor device according to some embodiments, the first source/drain contact 185 may be connected to one first wiring line 206.

For example, the first via 207 of the first wiring structure 205 may be connected to the connection portion 185c of the first source/drain contact 185.

Figure 20:
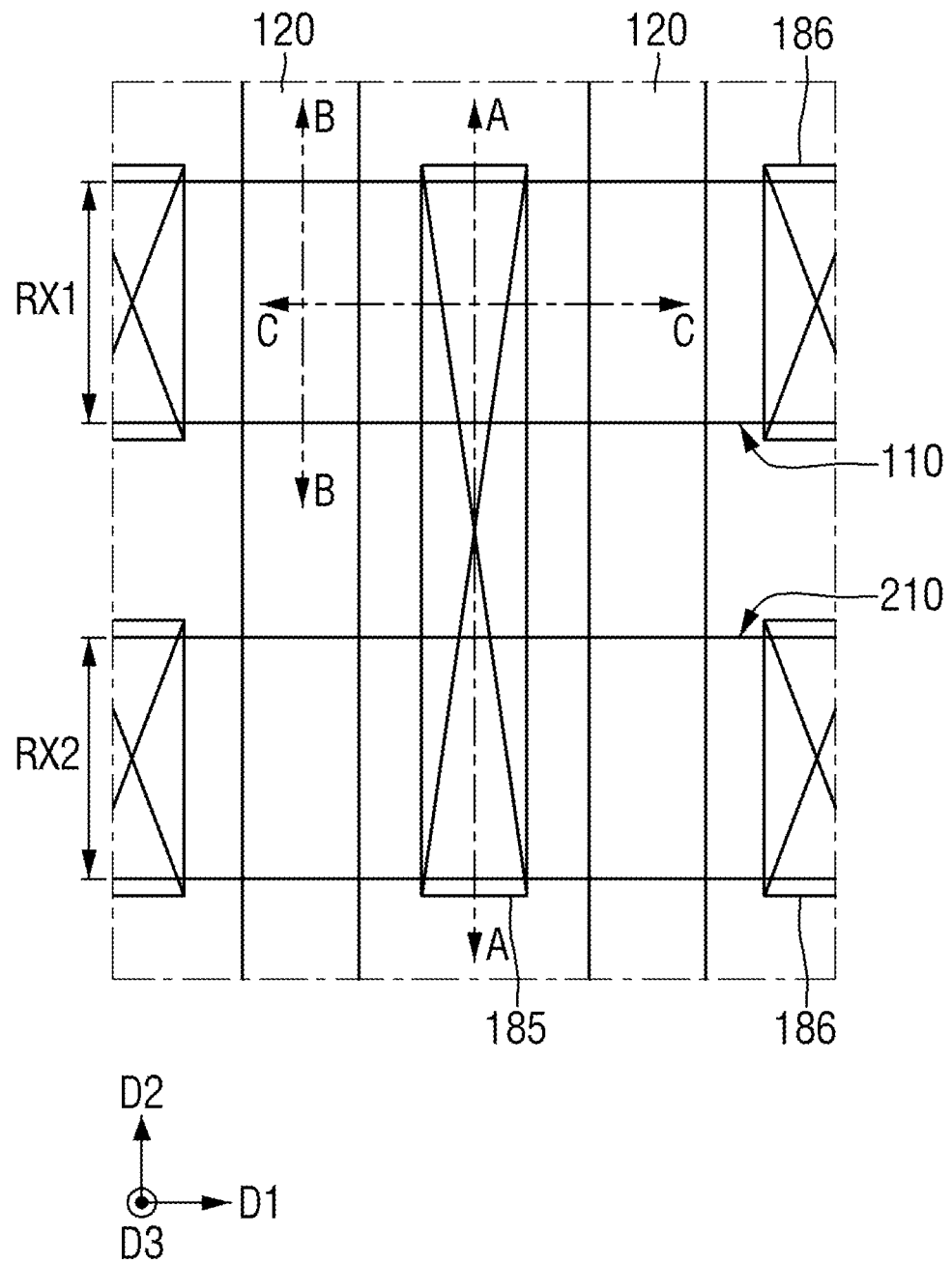
FIGS. 20 to 23B are diagrams illustrating a semiconductor device according to some embodiments.
Figure 21:
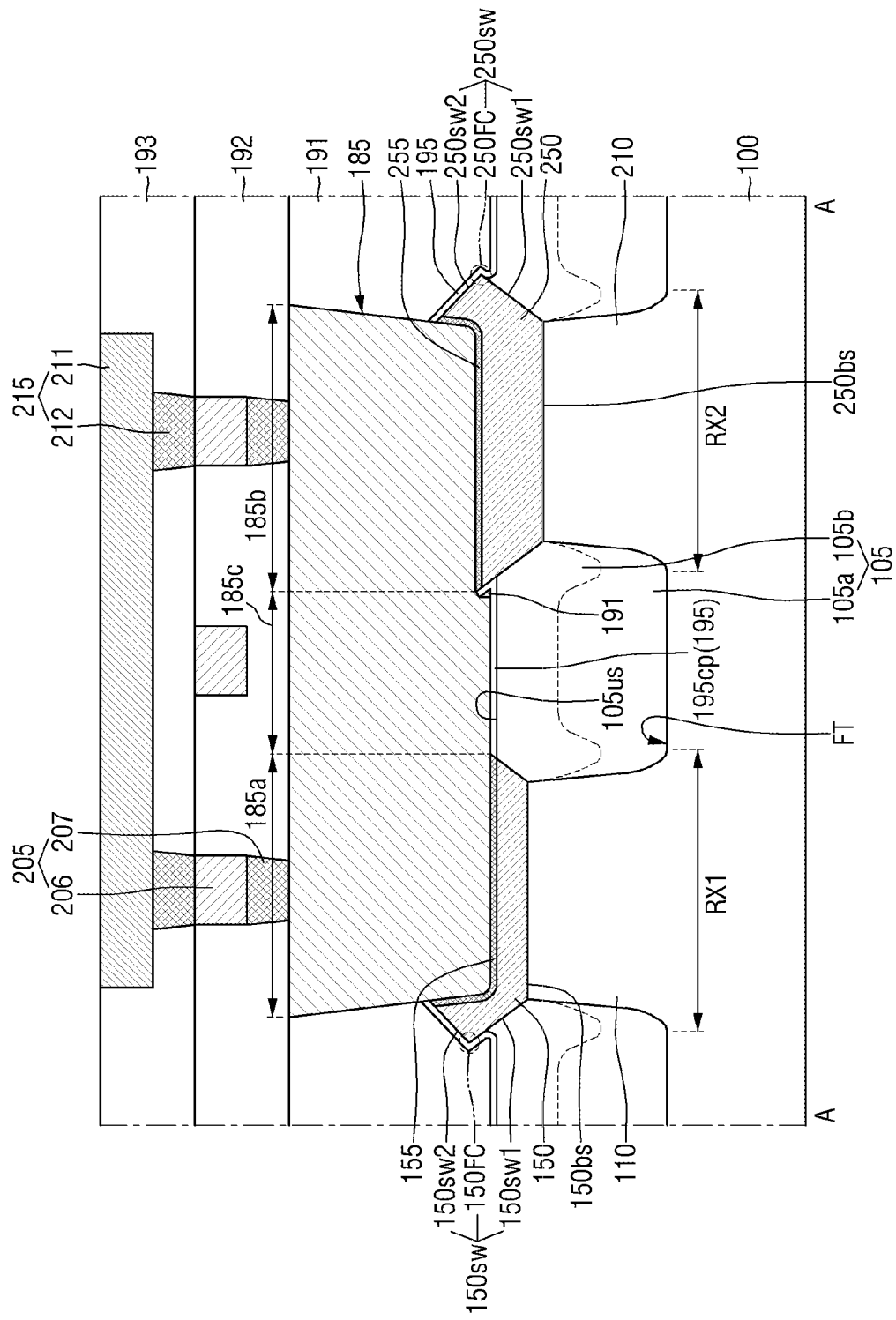
Figure 22:
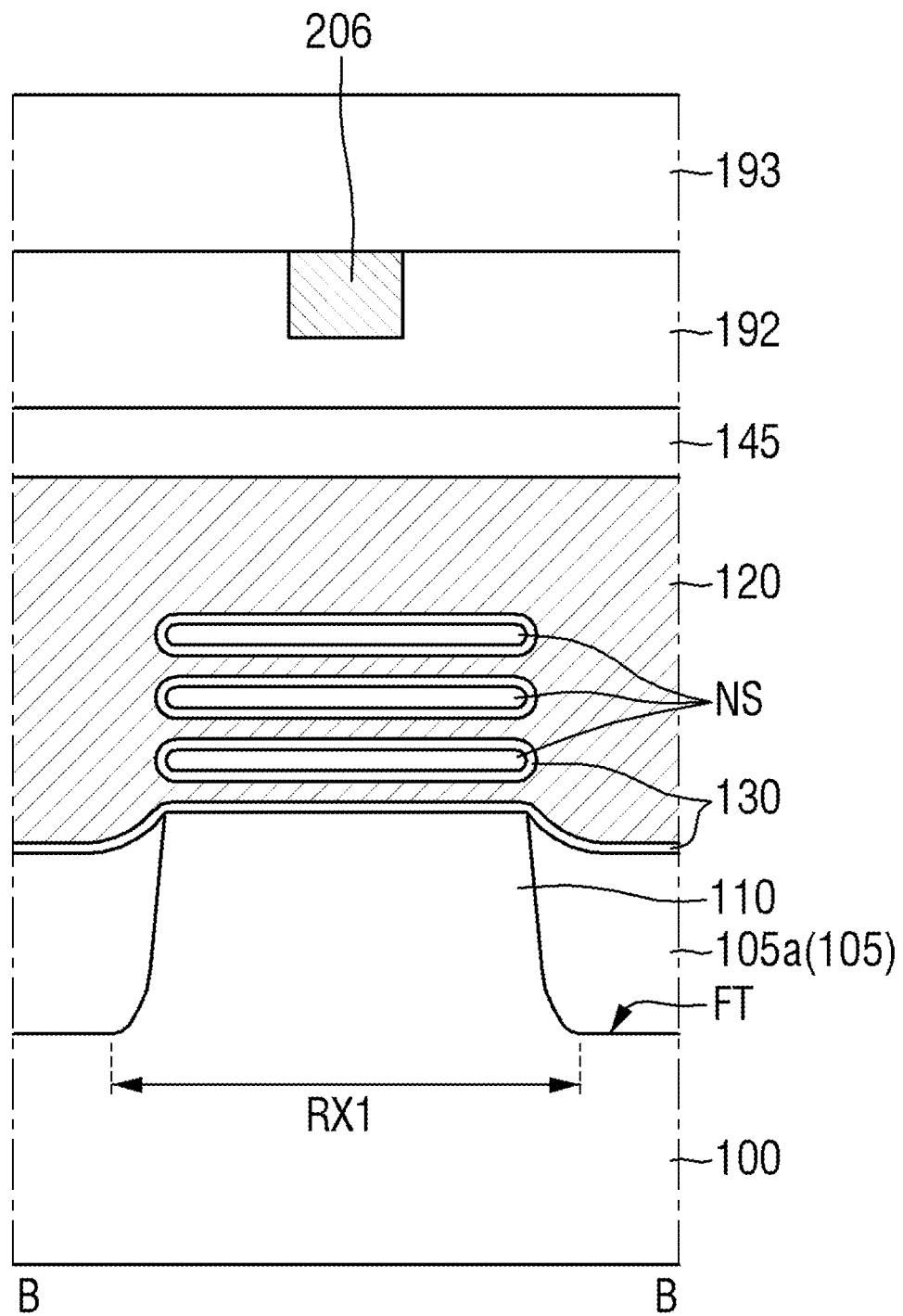
Figure 23A:
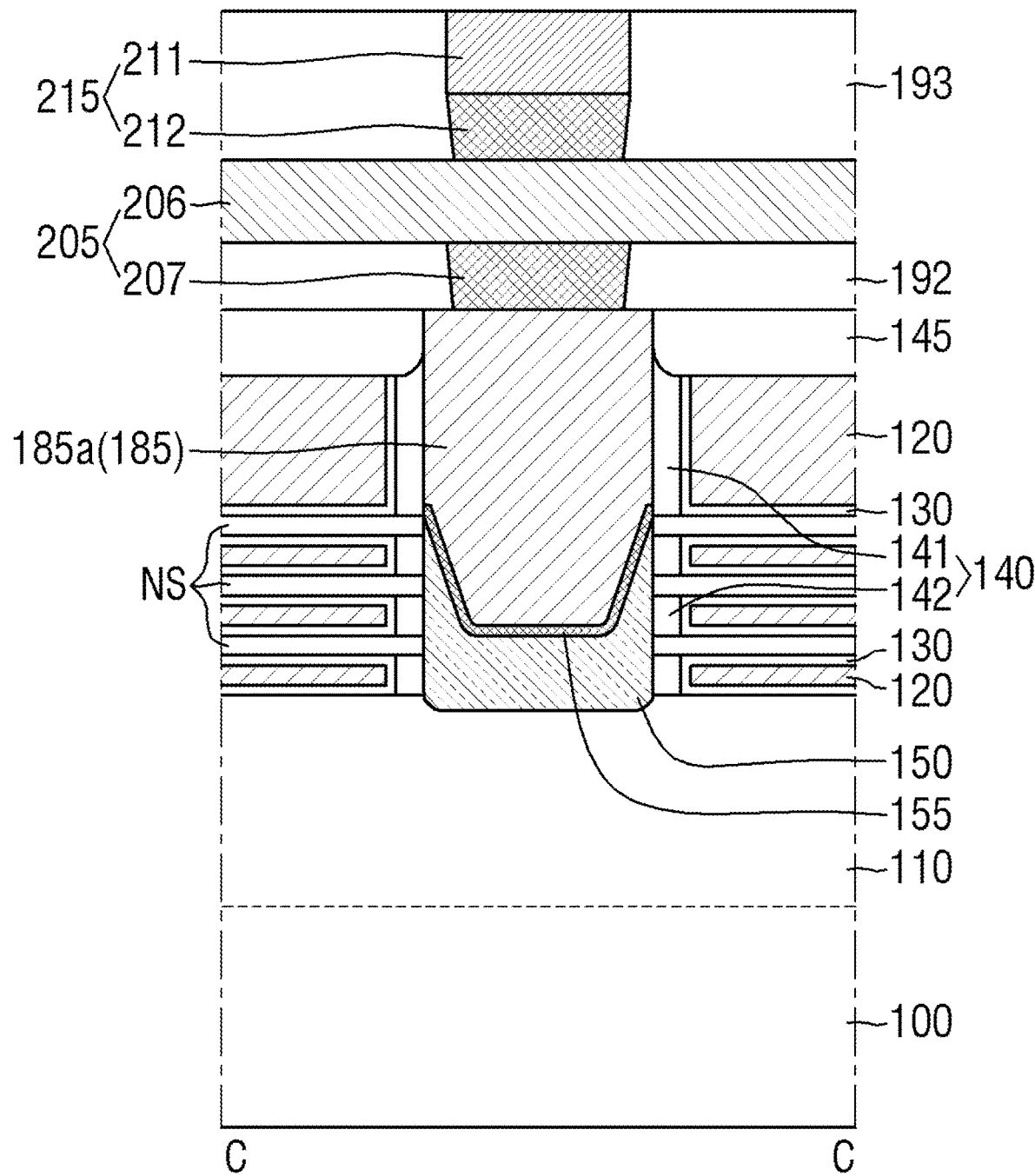
Figure 23B:
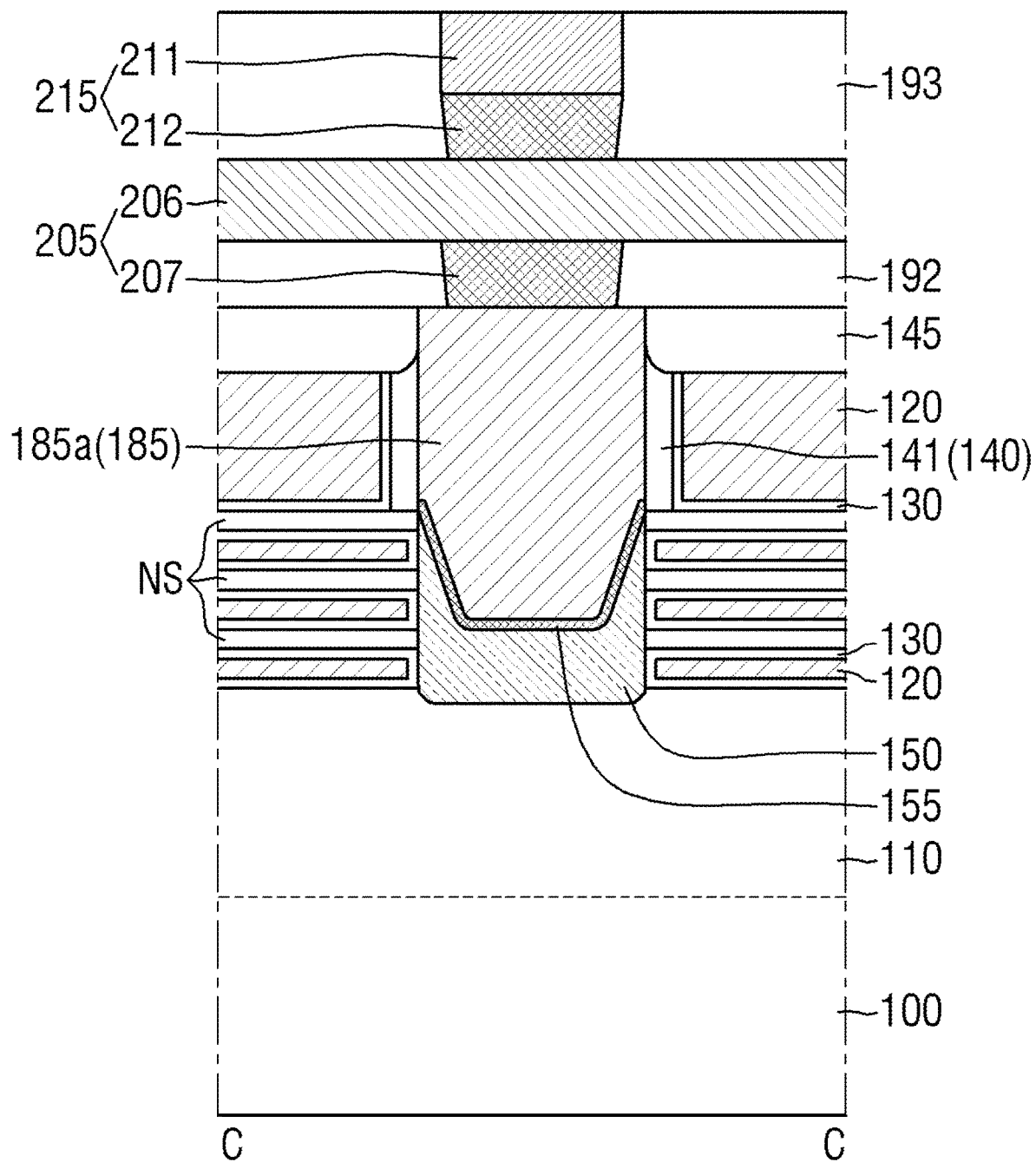

FIGS. 20 to 23B are diagrams illustrating a semiconductor device according to some embodiments. FIG. 20 is an exemplary layout diagram illustrating a semiconductor device according to some embodiments. FIG. 21 is a cross-sectional view taken along line A-A of FIG. 20. FIG. 22 is a cross-sectional view taken along line B-B of FIG. 20. FIGS. 23A and 23B are cross-sectional views taken along line C-C of FIG. 20. For simplicity of description, the following description will focus on differences from the description with reference to FIGS. 1 to 5.

Referring to FIGS. 20 to 23B, the semiconductor device according to some embodiments may further include a sheet pattern NS spaced apart from the first fin-shaped 110 in the third direction D3.

The first active region RX1 and the second active region RX2 may be distinguishable by the first fin-shaped pattern 110 and the second fin-shaped pattern 210. The fin trench FT may delimit the first active region RX1 and the second active region RX2.

In some embodiments, the first active region RX1 may be an NMOS forming region and the second active region RX2 may be a PMOS forming region. In some embodiments, the second active region RX2 may be an NMOS forming region and the first active region RX1 may be a PMOS forming region.

The sheet pattern NS may be on the first fin-shaped pattern 110 while being spaced apart from the first fin-shaped pattern 110. The sheet pattern NS may include a plurality of sheet patterns. For example, although three sheet patterns NS are illustrated for simplicity of description, the present disclosure is not limited thereto.

The gate insulating layer 130 may extend along the top surface of the first fin-shaped pattern 110 and the top surface of the first lower field insulating layer 105a. The gate insulating layer 130 may surround the sheet pattern NS.

The first gate electrode 120 may be on the first fin-shaped pattern 110. The first gate electrode 120 may intersect the first fin-shaped pattern 110. The first gate electrode 120 may surround the sheet pattern NS. The first gate electrode 120 may be between the first fin-shaped pattern 110 and the sheet pattern NS and between the adjacent sheet patterns NS.

In some embodiments, as shown in FIG. 23A, the gate spacer 140 may include an outer spacer 141 and an inner spacer 142. The inner spacer 142 may be between the first fin-shaped pattern 110 and the sheet pattern NS and between the adjacent sheet patterns NS.

In some embodiments, as shown in FIG. 23B, the gate spacer 140 may include only the outer spacer 141. An inner spacer may be absent from between the first fin-shaped pattern 110 and the sheet pattern NS and between the adjacent sheet patterns NS.

The first epitaxial pattern 150 may connect the sheet patterns NS adjacent in the first direction D1.

Although not shown, a sheet pattern spaced apart from the second fin-shaped pattern 210 in the third direction D3 may be further arranged on the second fin-shaped pattern 210. Further, the description of the sheet pattern on the second fin-shaped pattern 210 may be substantially the same as the description of the sheet pattern NS on the first fin-shaped pattern 110.

Figure 24:
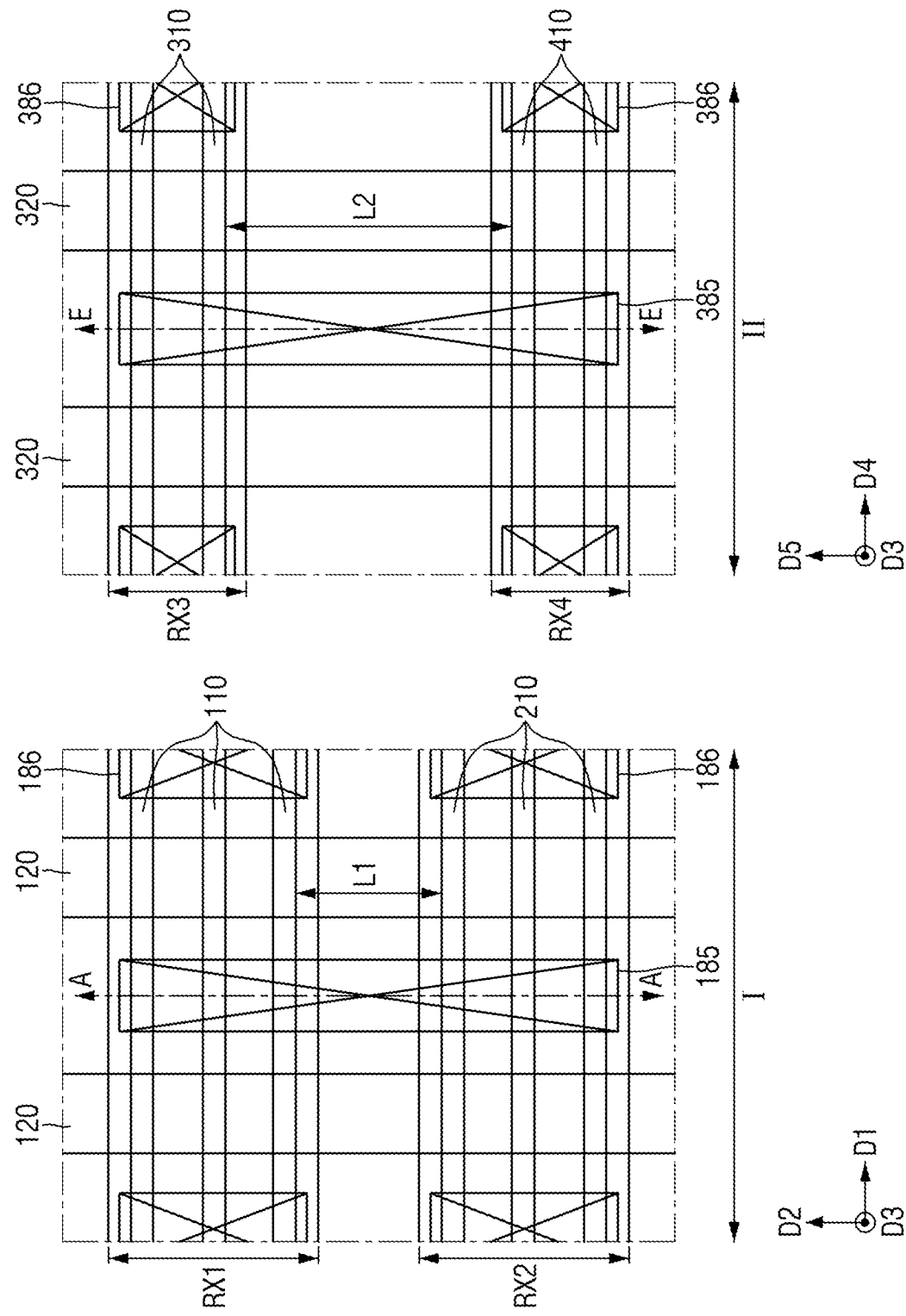
FIG. 24 is an exemplary layout diagram illustrating a semiconductor device according to some embodiments.
Figure 25:
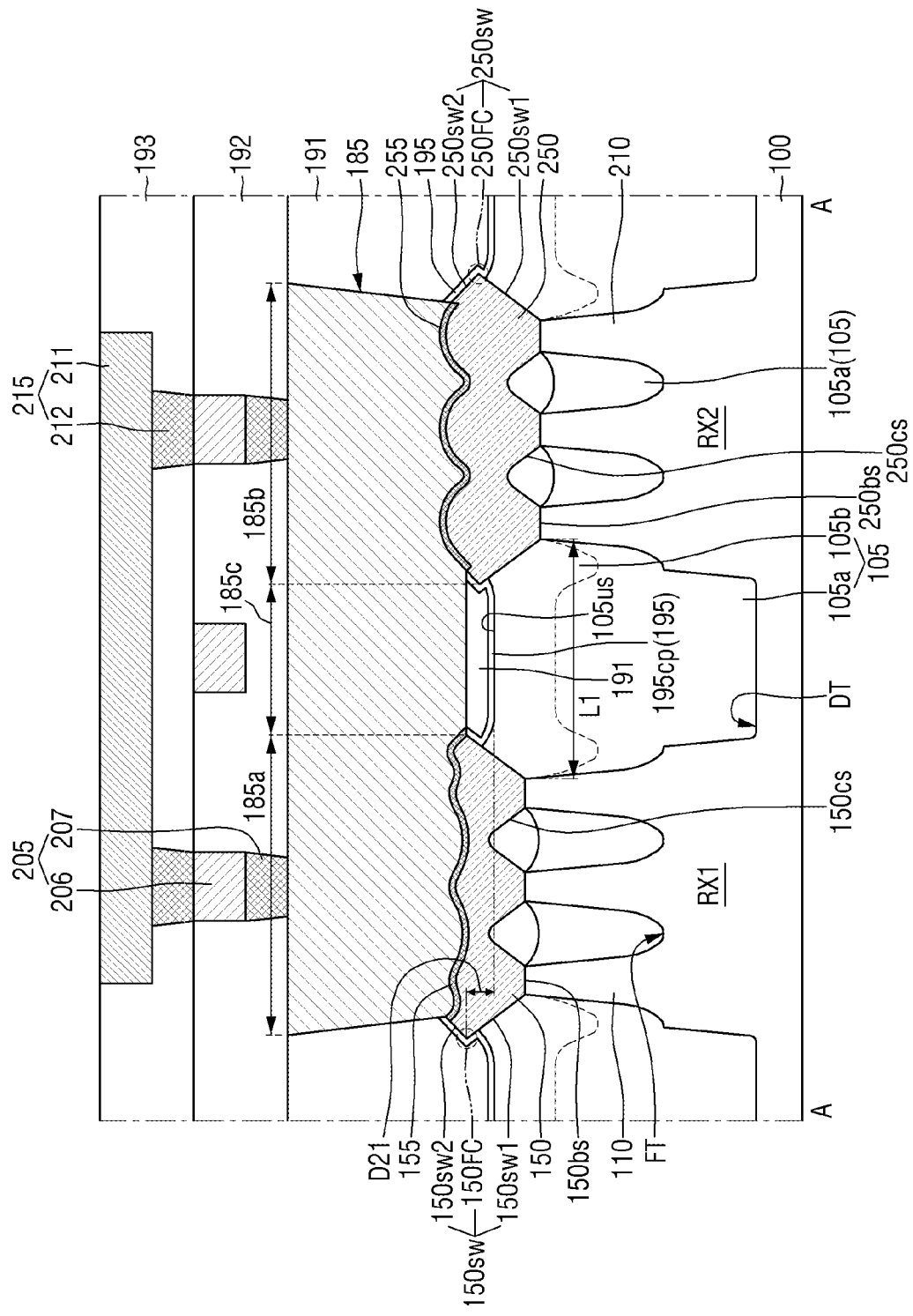
FIGS. 25 and 26 are cross-sectional views taken along lines A-A and E-E of FIG. 24.
Figure 26:
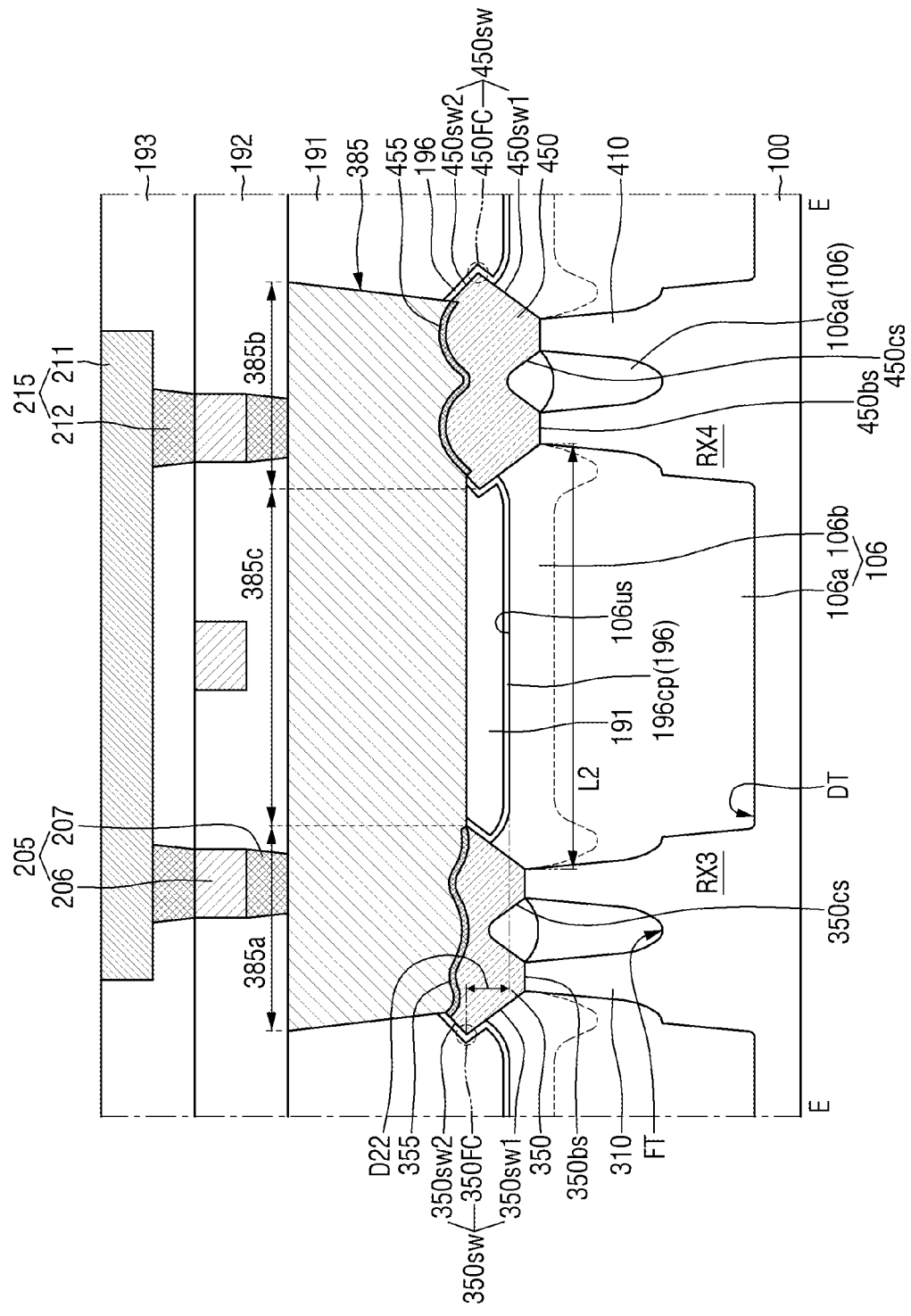

FIG. 24 is an exemplary layout diagram illustrating a semiconductor device according to some embodiments. FIGS. 25 and 26 are cross-sectional views taken along lines A-A and E-E of FIG. 24, respectively.

For reference, the layout diagram of a first region I of FIG. 24 may be substantially the same as the layout diagram of FIG. 1. Therefore, the description of the first region I of FIG. 24 will mainly focus on contents that have not been described with reference to FIGS. 1 to 5.

Referring to FIGS. 24 to 26, the semiconductor devices according to some embodiments may include a first fin-shaped pattern 110, a second fin-shaped pattern 210, a third fin-shaped pattern 310, a fourth fin-shaped pattern 410, a first field insulating layer 105, a second field insulating layer 106, a first gate electrode 120, a second gate electrode. 320, a first epitaxial pattern 150, a second epitaxial pattern 250, a third epitaxial pattern 350, a fourth epitaxial pattern 450, a first etch stop layer 195, a second etch stop layer 196, a first source/drain contact 185, and a third source/drain contact 385.

A substrate 100 may include a first region I and a second region II. In some embodiments, the first region I and the second region II may be spaced apart from each other. In some embodiments, the first region I and the second region II may be adjacent to each other, without spacing therebetween.

The first fin-shaped pattern 110, the second fin-shaped pattern 210, the first field insulating layer 105, the first gate electrode 120, the first epitaxial pattern 150, the second epitaxial pattern 250, the first etch stop layer 195, and the first source/drain contact 185 may be in the first region I of the substrate 100.

In the first region I of the substrate 100, the first epitaxial pattern 150 and the second epitaxial pattern 250 may be spaced apart from each other by a first distance L1 in the second direction D2. The first distance L1 may be defined as the shortest distance between the first fin-shaped pattern 110 and the second fin-shaped pattern 210.

Further, the depth from the facet intersection point 150FC of the first epitaxial pattern 150 to the top surface 105us of the first field insulating layer 105 between the first epitaxial pattern 150 and the second epitaxial pattern 250 may be a first depth D21.

The third fin-shaped pattern 310, the fourth fin-shaped pattern 410, the second field insulating layer 106, the second gate electrode 320, the third epitaxial pattern 350, the fourth epitaxial pattern 450, the second etch stop layer 196, and the third source/drain contact 385 may be in the second region II of the substrate 100.

The third fin-shaped pattern 310 may be formed in a third active region RX3 of the substrate 100. The fourth fin-shaped pattern 410 may be formed in a fourth active region RX4 of the substrate 100. The third fin-shaped pattern 310 and the fourth fin-shaped pattern 410 may be elongated along a fourth direction D4. The third fin-shaped pattern 310 and the fourth fin-shaped pattern 410 may be spaced apart from each other in a fifth direction D5. The fourth direction D4 may intersect the fifth direction D5 and the third direction D3.

The description of the third active region RX3 and the fourth active region RX4 may be substantially the same as the description of the first active region RX1 and the second active region RX2, and the description of the third fin-shaped pattern 310 and the fourth fin-shaped pattern 410 may be substantially the same as the description of the first fin-shaped pattern 110 and the second fin-shaped pattern 210. Although two third fin-shaped patterns 310 and two fourth fin-shaped patterns 410 are illustrated, the present disclosure is not limited thereto.

The second field insulating layer 106 may be formed on the substrate 100. The second field insulating layer 106 may fill a deep trench DT. The second field insulating layer 106 may fill a part of a fin trench FT.

The second field insulating layer 106 may be arranged around the third fin-shaped pattern 310 and the fourth fin-shaped pattern 410. The second field insulating layer 106 may cover at least a part of the sidewall of the third fin-shaped pattern 310 and at least a part of the sidewall of the fourth fin-shaped pattern 410. As shown in FIG. 3, a part of the third fin-shaped pattern 310 and a part of the fourth fin-shaped pattern 410 may protrude or extend more upward than the top surface of the second field insulating layer 106.

The second field insulating layer 106 may include a second lower field insulating layer 106a and a second supporting field insulating layer 106b. The second supporting field insulating layer 106b may be on the second lower field insulating layer 106a.

The second field insulating layer 106 and the first field insulating layer 105 may be formed at the same time. In other words, the second lower field insulating layer 106a and the first lower field insulating layer 105a may be formed at the same time, and the second supporting field insulating layer 106b and the first supporting field insulating layer 105b may be formed at the same time. The description of the second field insulating layer 106 may be substantially the same as the description of the first field insulating layer 105.

The second gate electrode 320 may be on the second field insulating layer 106. The second gate electrode 320 may intersect the third fin-shaped pattern 310 and the fourth fin-shaped pattern 410.

The third epitaxial pattern 350 may be on the third fin-shaped pattern 310. The third epitaxial pattern 350 may be between the second gate electrodes 320 adjacent in the fourth direction D4. The third epitaxial pattern 350 may be connected to the third fin-shaped pattern 310. The third epitaxial pattern 350 may be in the third active region RX3.

The fourth epitaxial pattern 450 may be on the fourth fin-shaped pattern 410. The fourth epitaxial pattern 450 may be connected to the fourth fin-shaped pattern 410. The fourth epitaxial pattern 450 may be in the fourth active region RX4. The fourth epitaxial pattern 450 may be separated from the third epitaxial pattern 350 in the fifth direction D5. In other words, the fourth epitaxial pattern 450 may not be directly connected to the third epitaxial pattern 350.

The third epitaxial pattern 350 may include a bottom surface 350bs, a sidewall 350sw, and a connection surface 350cs. The sidewall 350sw of the third epitaxial pattern 350 may include a lower sidewall 350sw1, an upper sidewall 350sw2, and a facet intersection point 350FC.

The fourth epitaxial pattern 450 may include a bottom surface 450bs, a sidewall 450sw, and a connection surface 450cs. The sidewall 450sw of the fourth epitaxial pattern 450 may include a lower sidewall 450sw1, an upper sidewall 450sw2, and a facet intersection point 450FC.

The description of the third epitaxial pattern 350 and the fourth epitaxial pattern 450 may be substantially the same as the description of the first epitaxial pattern 150 and the second epitaxial pattern 250, and thus will be omitted.

With respect to the top surface of the substrate 100, a top surface 106us of the second field insulating layer 106 may be higher than the bottom surface 350bs of the third epitaxial pattern 350 and the bottom surface 450bs of the fourth epitaxial pattern 450. The top surface 106us of the second field insulating layer 106 may be lower than or at the same level as the facet intersection point 350FC of the third epitaxial pattern 350 and the facet intersection point 450 FC of the fourth epitaxial pattern 450.

In the semiconductor device according to some embodiments, the height from the bottom surface of the fin trench FT to the bottom surface 350bs of the third epitaxial pattern 350 may be higher than the height from the bottom surface of the fin trench FT to the bottom surface 450bs of the fourth epitaxial pattern 450.

The height from the bottom surface of the fin trench FT to the facet intersection point 350FC of the third epitaxial pattern 350 may be different from the height from the bottom surface of the fin trench FT to the facet intersection point 450FC of the fourth epitaxial pattern 450.

In the second region II of the substrate 100, the third epitaxial pattern 350 and the fourth epitaxial pattern 450 may be spaced apart from each other by a second distance L2 in the fifth direction D5. The second distance L2 may be defined as the shortest distance between the third fin-shaped pattern 310 and the fourth fin-shaped pattern 410.

Further, the depth from the facet intersection point 350FC of the third epitaxial pattern 350 to the top surface 106us of the second field insulating layer 106 between the third epitaxial pattern 350 and the fourth epitaxial pattern 450 may be a second depth D22. When the top surface 106us of the second field insulating layer 106 between the third epitaxial pattern 350 and the fourth epitaxial pattern 450 has a W shape as shown in FIG. 11, the second depth D22 may be the depth from the facet intersection point 350FC of the third epitaxial pattern 350 to the lowermost portion of the top surface 106us of the second field insulating layer 106.

The second etch stop layer 196 may extend along the top surface of the second field insulating layer 106, the sidewall 350sw of the third epitaxial pattern 350, and the sidewall 450sw of the fourth epitaxial pattern 450. The second etch stop layer 196 may be in contact with the second field insulating layer 106. The second etch stop layer 196 may include a connection part 196cp extending along the top surface 106us of the second field insulating layer 106 between the third epitaxial pattern 350 and the fourth epitaxial pattern 450.

The description of the second etch stop layer 196 may be substantially the same as the description of the first etch stop layer 195, and thus will be omitted.

The third source/drain contact 385 may be on the third epitaxial pattern 350 and the fourth epitaxial pattern 450. A fourth source/drain contact 386 may be on one of the third epitaxial pattern 350 and the fourth epitaxial pattern 450 and may be absent from the other of the third epitaxial pattern 350 and the fourth epitaxial pattern 450.

A third silicide layer 355 may be formed between the second source/drain contact 385 and the third epitaxial pattern 350. A fourth silicide layer 455 may be formed between the second source/drain contact 385 and the fourth epitaxial pattern 450.

The third source/drain contact 385 may include a first portion 385a, a second portion 385b, and a connection 385c. The first portion 385a of the third source/drain contact 385 may overlap the third epitaxial pattern 350 in the vertical direction. The second portion 385b of the third source/drain contact 385 may overlap the fourth epitaxial pattern 450 in the vertical direction. The connection portion 385c of the third source/drain contact 385 may not overlap the third epitaxial pattern 350 and the fourth epitaxial pattern 450 in the vertical direction.

The description of the second source/drain contact 385 may be substantially the same as the description of the first source/drain contact 185, and thus will be omitted.

The first active region RX1 and the third active region RX3 may be regions where transistors of the same conductivity type are formed. The second active region RX2 and the fourth active region RX4 may be regions where transistors of the same conductivity type are formed. In the semiconductor device according to some embodiments, the first active region RX1 and the third active region RX3 may be PMOS forming regions, and the second active region RX2 and the fourth active region RX4 may be NMOS forming regions.

In the semiconductor device according to some embodiments, the distance L1 between the first epitaxial pattern 150 and the second epitaxial pattern 250 in the second direction D2 may be smaller than the distance L2 between the third epitaxial pattern 350 and the fourth epitaxial pattern 450 in the fifth direction D5. The first depth D21 from the facet intersection point 150FC of the first epitaxial pattern 150 to the top surface 105us of the first field insulating layer 105 may be smaller than the second depth D22 from the facet intersection point 350FC of the third epitaxial pattern 350 to the top surface 106us of the second field insulating layer 106.

FIGS. 27 to 30 are views illustrating the intermediate steps of a method of manufacturing a semiconductor device according to some embodiments.

Figure 27:
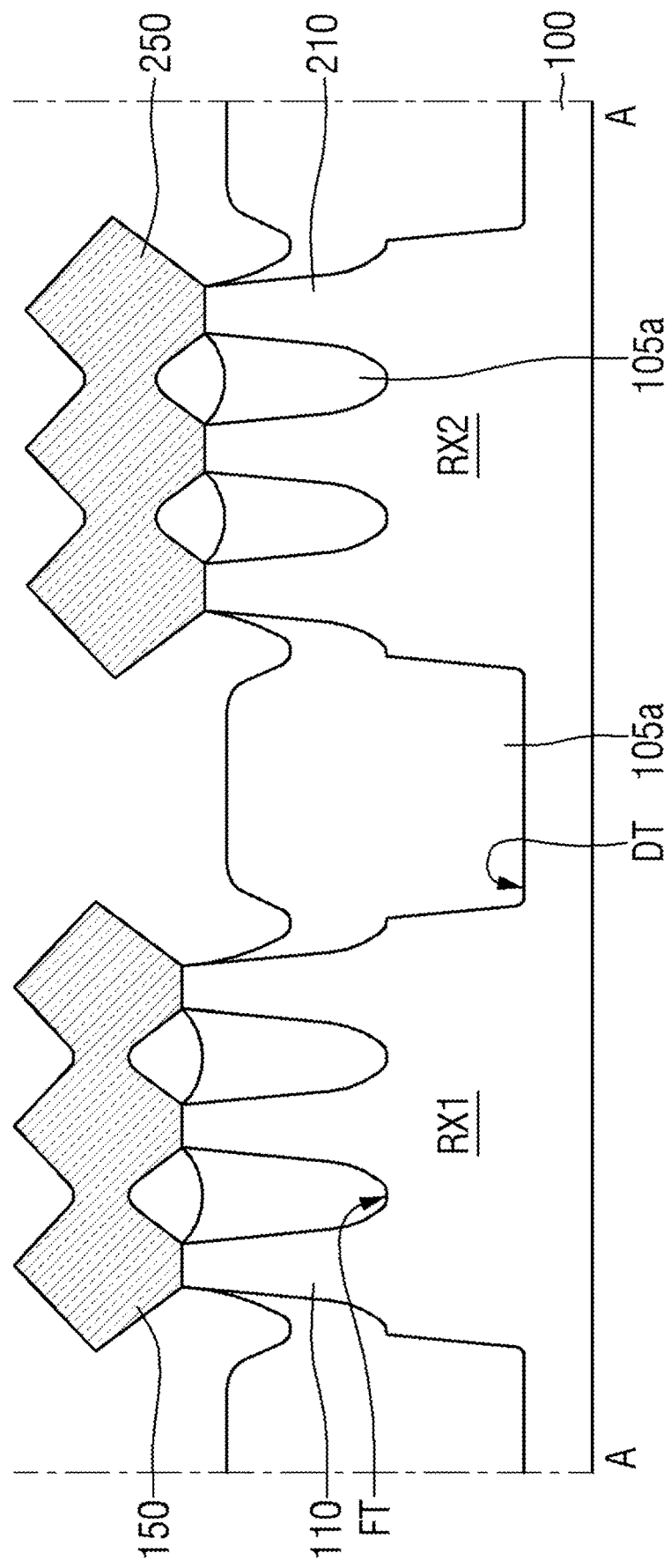
FIGS. 27 to 30 are views illustrating the intermediate steps of a method of manufacturing a semiconductor device according to some embodiments.

Referring to FIG. 27, the first epitaxial pattern 150 may be formed on the first fin-shaped pattern 110 of the first active region RX1. The second epitaxial pattern 250 may be formed on the second fin-shaped pattern 210 of the second active region RX2.

When the first active region RX1 and the second active region RX2 are regions where transistors of different conductivity types are formed, the first epitaxial pattern 150 and the second epitaxial pattern 250 may be formed by different processes.

During the formation of the first epitaxial pattern 150 and the second epitaxial pattern 250, the shape of the top surface of the first lower field insulating layer 105a may be changed to a W shape.

Figure 28:
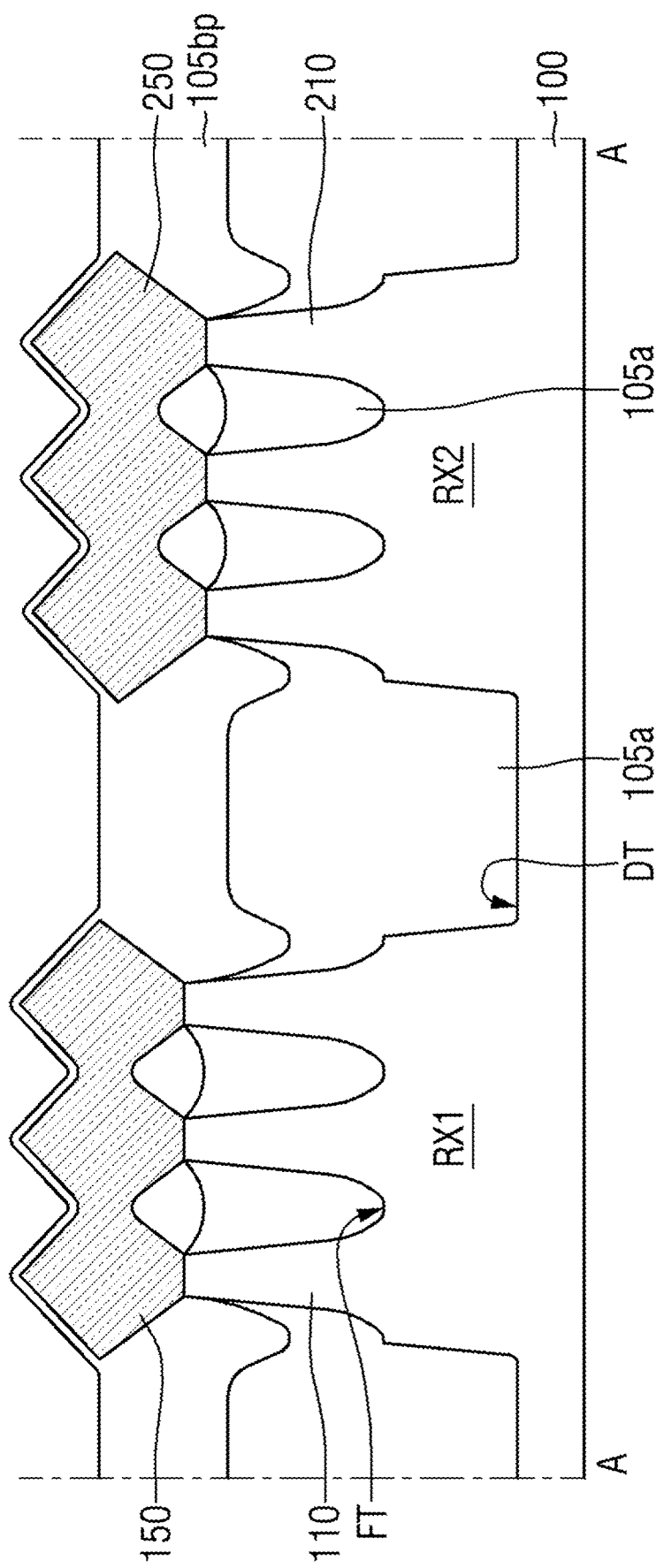

Referring to FIG. 28, a pre-supporting field insulating layer 105bp may be formed on the first lower field insulating layer 105a.

The pre-supporting field insulating layer 105bp may be thickly formed on the first lower field insulating layer 105a. However, the pre-supporting field insulating layer 105bp may be thinly formed on the first epitaxial pattern 150 and the second epitaxial pattern 250.

The pre-supporting field insulating layer 105bp may be deposited using fluorine (F) as an inhibitor. The pre-supporting field insulating layer 105bp may contain fluorine. The fluorine contained in the pre-supporting field insulating layer 105bp may be, but is not necessarily, diffused into the first lower field insulating layer 105a.

Figure 29:
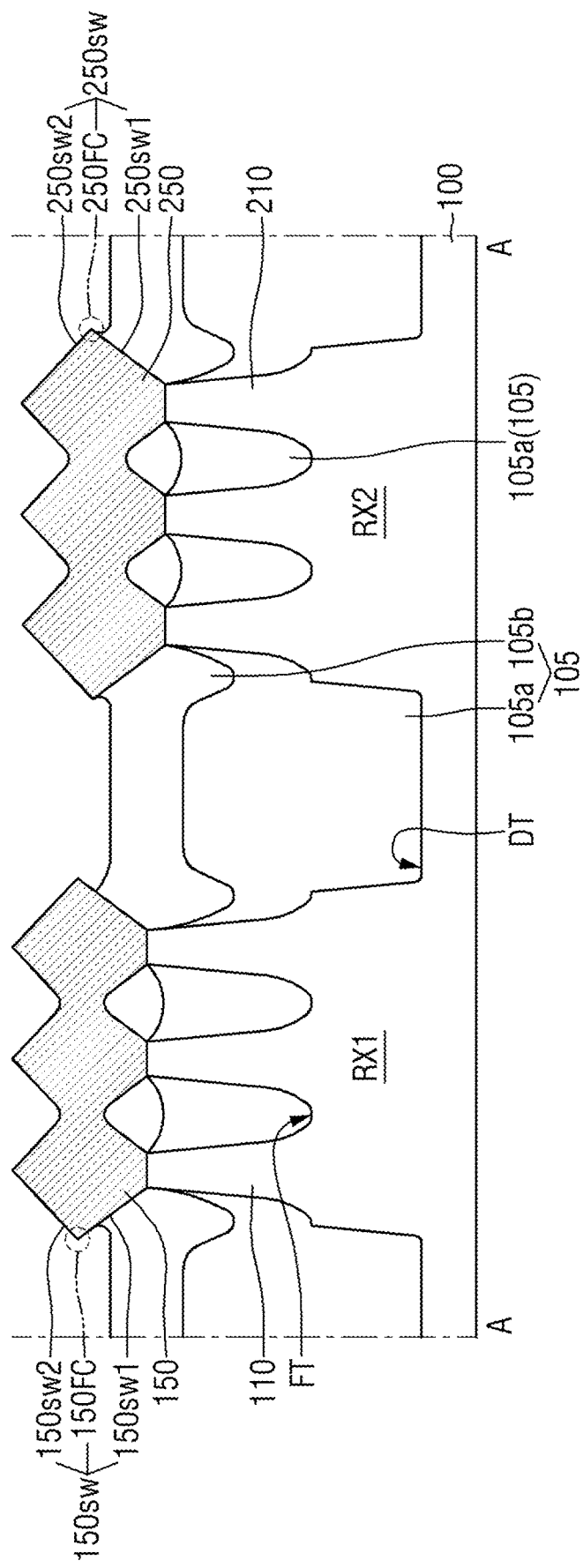

Referring to FIG. 29, a part of the free supporting field insulating layer 105bp may be removed to form a first supporting field insulating layer 105b on the first lower field insulating layer 105a. Accordingly, the first field insulating layer 105 may be formed on the substrate 100.

The first field insulating layer 105 may include the first lower field insulating layer 105a and the first supporting field insulating layer 105b.

The first supporting field insulating layer 105b may cover a part of the sidewall 150sw of the first epitaxial pattern 150 and a part of the sidewall 250sw of the second epitaxial pattern 250. For example, the first supporting field insulating layer 105b may cover at least a part of the lower sidewall 150sw1 of the first epitaxial pattern 150 and at least a part of the lower sidewall 250sw1 of the second epitaxial pattern 250.

The top surface of the first field insulating layer 105 may be lower than the facet intersection point 150FC of the first epitaxial pattern 150 and the facet intersection point 250FC of the second epitaxial pattern 250.

The first field insulating layer 105 may not cover the upper sidewall 150sw2 of the first epitaxial pattern 150 and the upper sidewall 250sw2 of the second epitaxial pattern 250.

Figure 30:
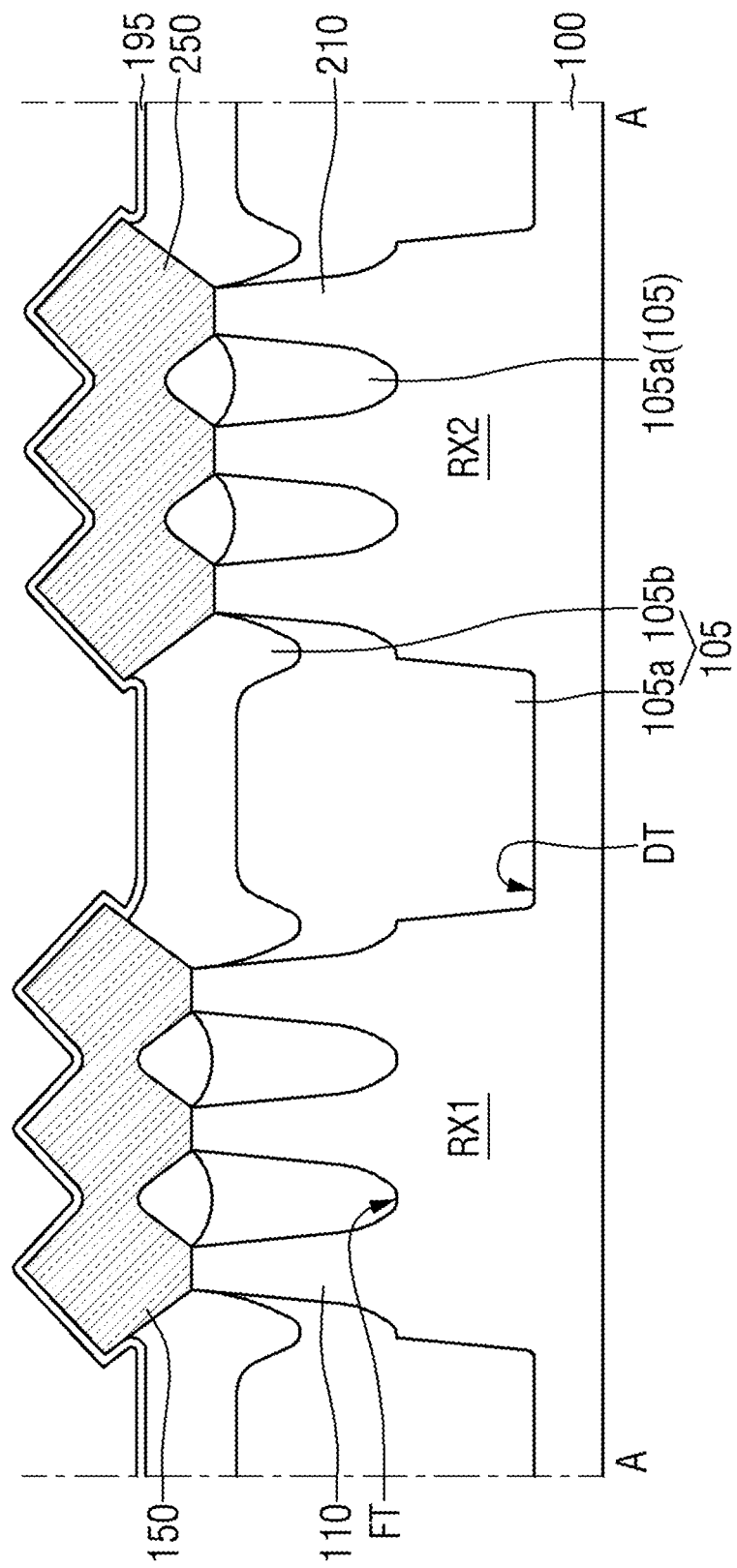

Referring to FIG. 30, the first etch stop layer 195 may be formed on the first field insulating layer 105, the first epitaxial pattern 150, and the second epitaxial pattern 250.

The first etch stop layer 195 may extend along the top surface of the first field insulating layer 105. Further, the first etch stop layer 195 may be formed on the first epitaxial pattern 150 and the second epitaxial pattern 250 that are not covered by the first field insulating layer 105.

Next, after the first interlayer insulating layer 191 (see FIG. 2) is formed, the first source/drain contact 185 (see FIG. 2) may be formed.

In concluding the detailed description, those skilled in the art will appreciate that many variations and modifications may be made to the preferred embodiments without substantially departing from the principles of the present inventive concepts. Therefore, the disclosed preferred embodiments of the inventive concepts are used in a generic and descriptive sense only and not for purposes of limitation.

What is claimed is:

1. A semiconductor device comprising:
   first and second first fin-shaped patterns on a substrate, the first fin-shaped patterns extending in a first direction;
   first and second second fin-shaped patterns on the substrate, the second fin-shaped patterns extending in the first direction and spaced apart from the first fin-shaped patterns in a second direction;
   a first epitaxial pattern on the first and second first fin-shaped patterns, the first epitaxial pattern including a bottommost surface connected to the first fin-shaped patterns;
   a second epitaxial pattern on the first and second second fin-shaped patterns, the second epitaxial pattern including a bottommost surface connected to the second fin-shaped patterns and separated from the first epitaxial pattern;
   a field insulating layer on the substrate, the field insulating layer covering a sidewall of the first of the first fin-shaped patterns, a sidewall of the first of the second fin-shaped patterns, a part of a sidewall of the first epitaxial pattern, and a part of a sidewall of the second epitaxial pattern, wherein an uppermost surface of a first portion of the field insulating layer that is between the first epitaxial pattern and the second epitaxial pattern is higher than an uppermost surface of a second portion of the field insulating layer that is between the first and second first fin-shaped patterns, and the uppermost surface of the first portion of the field insulating layer is higher than an uppermost surface of a third portion of the field insulating layer that is between the first and second second fin-shaped patterns;
   an etch stop layer extending across a topmost surface of the field insulating layer, the sidewall of the first epitaxial pattern, and the sidewall of the second epitaxial pattern, and in contact with the field insulating layer; and
   a source/drain contact on the first epitaxial pattern and the second epitaxial pattern, the source/drain contact connected to the first epitaxial pattern and the second epitaxial pattern, wherein the topmost surface of the field insulating layer is higher than the bottommost surface of the first epitaxial pattern and the bottommost surface of the second epitaxial pattern, wherein the sidewall of the first epitaxial pattern includes a first inclined portion inclined with respect to a vertical direction, wherein the sidewall of the second epitaxial pattern includes a second inclined portion inclined with respect to the vertical direction, wherein the first portion of the field insulating layer contacts the first inclined portion of the sidewall of the first epitaxial pattern and the second inclined portion of the sidewall of the second epitaxial pattern, and wherein a height from the bottommost surface of the second epitaxial pattern to a bottom surface of the source/drain contact at a portion of the source/drain contact overlapping one of the second fin-shaped patterns is greater than a height from the bottommost surface of the first epitaxial pattern to the bottom surface of the source/drain contact at the portion overlapping one of the first fin-shaped patterns.

2. The semiconductor device of claim 1, wherein each of the first epitaxial pattern and the second epitaxial pattern includes a facet intersection point along a sidewall thereof at which a width of the first epitaxial pattern and the second epitaxial pattern in the second direction is at a maximum, wherein the topmost surface of the field insulating layer is lower than or at the same level as the facet intersection point of the first epitaxial pattern and the facet intersection point of the second epitaxial pattern, and wherein the source/drain contact does not vertically overlap the facet intersection point of the first epitaxial pattern and does not vertically overlap the facet intersection point of the second epitaxial pattern.

3. The semiconductor device of claim 1, wherein the topmost surface of the field insulating layer between the first epitaxial pattern and the second epitaxial pattern has a concave shape.

4. The semiconductor device of claim 1, wherein the topmost surface of the field insulating layer between the first epitaxial pattern and the second epitaxial pattern includes a first portion having a concave shape and a second portion having a convex shape.

5. The semiconductor device of claim 1, wherein the field insulating layer includes:
a lower field insulating layer that covers at least a part of the sidewall of the first of the first fin-shaped patterns and at least a part of the first of the second fin-shaped patterns; and
a supporting field insulating layer on the lower field insulating layer that covers a part of the sidewall of the first epitaxial pattern and a part of the sidewall of the second epitaxial pattern.

6. The semiconductor device of claim 5, wherein a concentration of fluorine included in the supporting field insulating layer is greater than a concentration of fluorine included in the lower field insulating layer.

7. The semiconductor device of claim 1, wherein the source/drain contact includes a connection portion that does not overlap the first epitaxial pattern and the second epitaxial pattern in the vertical direction, wherein the etch stop layer includes a connection part that extends across the topmost surface of the field insulating layer between the first epitaxial pattern and the second epitaxial pattern, and wherein the connection portion of the source/drain contact is spaced apart from the connection part of the etch stop layer in the vertical direction.

8. The semiconductor device of claim 1, wherein the source/drain contact includes a connection portion that does not overlap the first epitaxial pattern and the second epitaxial pattern in the vertical direction, wherein the etch stop layer includes a connection part that extends across the topmost surface of the field insulating layer between the first epitaxial pattern and the second epitaxial pattern, and wherein the connection portion of the source/drain contact is in contact with the connection part of the etch stop layer.

9. The semiconductor device of claim 1, wherein the source/drain contact includes a connection portion that does not overlap the first epitaxial pattern and the second epitaxial pattern in the vertical direction, wherein the etch stop layer includes a connection part that extends across the topmost surface of the field insulating layer between the first epitaxial pattern and the second epitaxial pattern, and wherein the connection portion of the source/drain contact penetrates the connection part of the etch stop layer.

10. The semiconductor device of claim 1, further comprising:
a plurality of first wiring lines connected to the source/drain contact and at a first metal level; and
a second wiring line at a second metal level higher than the first metal level and configured to connect the plurality of first wiring lines.

11. The semiconductor device of claim 10, wherein the source/drain contact includes:
a line portion extending in the first direction and configured to connect the first epitaxial pattern to the second epitaxial pattern; and
a first protruding portion and a second protruding portion configured to protrude from the line portion of the source/drain contact and connected to the plurality of first wiring lines.

12. The semiconductor device of claim 11, wherein the line portion of the source/drain contact, the first protruding portion of the source/drain contact, and the second protruding portion of the source/drain contact have an integral structure.

13. The semiconductor device of claim 1, further comprising:
a gate electrode on the first fin-shaped patterns, the gate electrode intersecting the first fin-shaped patterns; and
a sheet pattern spaced apart from the first fin-shaped patterns and surrounded by the gate electrode.

14. A semiconductor device comprising:
first, second, third, and fourth pluralities of fin-shaped patterns, the first and second pluralities of fin-shaped patterns in a first region of a substrate, and the third and fourth pluralities of fin-shaped patterns in a second region of the substrate;
a first epitaxial pattern on the first plurality of fin-shaped patterns and a second epitaxial pattern on the second plurality of fin-shaped patterns in the first region of the substrate, the first and second epitaxial patterns separated from each other by a first distance;
a third epitaxial pattern on the third plurality of fin-shaped patterns and a fourth epitaxial pattern on the fourth plurality of fin-shaped patterns in the second region of the substrate, the third and fourth epitaxial patterns separated from each other by a second distance, wherein a shortest distance between the third plurality of fin-shaped patterns and the fourth plurality of fin-shaped patterns is longer than a shortest distance between the first plurality of fin-shaped patterns and the second plurality of fin-shaped patterns;
a first field insulating layer that covers a part of a sidewall of the first epitaxial pattern and a part of a sidewall of the second epitaxial pattern on the substrate between the first epitaxial pattern and the second epitaxial pattern;
a second field insulating layer that covers a part of a sidewall of the third epitaxial pattern and a part of a sidewall of the fourth epitaxial pattern on the substrate between the third epitaxial pattern and the fourth epitaxial pattern;
a first etch stop layer that extends across a topmost surface of the first field insulating layer, a sidewall of the first epitaxial pattern, and a sidewall of the second epitaxial pattern, and is in contact with the first field insulating layer;
a second etch stop layer that extends across a topmost surface of the second field insulating layer, a sidewall of the third epitaxial pattern, and a sidewall of the fourth epitaxial pattern, and is in contact with the second field insulating layer;
a first source/drain contact that is connected to the first epitaxial pattern and the second epitaxial pattern; and
a second source/drain contact that is separated from the first source/drain contact and connected to the third epitaxial pattern and the fourth epitaxial pattern,
wherein each of the first epitaxial pattern and the third epitaxial pattern includes a facet intersection point along a sidewall thereof where its width is at a maximum,
wherein the first source/drain contact includes a first portion that vertically overlaps the first epitaxial pattern, a second portion that vertically overlaps the second epitaxial pattern, and a first connection portion that directly connects the first portion of the first source/drain contact to the second portion of the first source/drain contact,
wherein the second source/drain contact includes a third portion that vertically overlaps the third epitaxial pattern, a fourth portion that vertically overlaps the fourth epitaxial pattern, and a second connection portion that directly connects the third portion of the second source/drain contact to the fourth portion of the second source/drain contact,
wherein the first distance is smaller than the second distance, and
wherein a depth from the facet intersection point of the first epitaxial pattern to the topmost surface of the first field insulating layer is smaller than a depth from the facet intersection point of the third epitaxial pattern to the topmost surface of the second field insulating layer.

15. The semiconductor device of claim 14, wherein the topmost surface of the first field insulating layer is lower than the facet intersection point of the first epitaxial pattern,
wherein the topmost surface of the second field insulating layer is lower than the facet intersection point of the second epitaxial pattern, and
wherein the third plurality of fin-shaped patterns and the fourth plurality of fin-shaped patterns each comprise fewer fin-shaped patterns than each of the first plurality of fin-shaped patterns and the second plurality of fin-shaped patterns.

16. A semiconductor device comprising:
a first plurality of fin-shaped patterns in a PMOS region of a substrate, extending in a first direction, and defined by a fin trench;
a second plurality of fin-shaped patterns in an NMOS region of the substrate, spaced apart from the first plurality of fin-shaped patterns in a second direction, the second plurality of fin-shaped patterns extending in the first direction, and defined by the fin trench;
a first epitaxial pattern on the first plurality of fin-shaped patterns, the first epitaxial pattern including a bottommost surface connected to the first plurality of fin-shaped patterns;
a second epitaxial pattern on the second plurality of fin-shaped patterns, the second epitaxial pattern separated from the first epitaxial pattern and including a bottommost surface connected to the second plurality of fin-shaped patterns;
a field insulating layer on the substrate, the field insulating layer covering a sidewall of a first of the first plurality of fin-shaped patterns, a sidewall of a first of the second plurality of fin-shaped patterns, a part of a sidewall of the first epitaxial pattern, and a part of a sidewall of the second epitaxial pattern;
an etch stop layer extending across a topmost surface of the field insulating layer, the sidewall of the first epitaxial pattern, and the sidewall of the second epitaxial pattern, and in contact with the field insulating layer, and
a source/drain contact on the first epitaxial pattern and the second epitaxial pattern, the source/drain contact connected to the first epitaxial pattern and the second epitaxial pattern,
wherein the source/drain contact includes a first portion that vertically overlaps the first epitaxial pattern, a second portion that vertically overlaps the second epitaxial pattern, and a connection portion that directly connects the first portion of the source/drain contact to the second portion of the source/drain contact,
wherein a height from a bottommost surface of the fin trench to a bottommost surface of the first portion of the source/drain contact at a portion that overlaps one of the first plurality of fin-shaped patterns is greater than a height from the bottommost surface of the fin trench to a bottommost surface of the second portion of the source/drain contact at a portion that overlaps one of the second plurality of fin-shaped patterns,
wherein a first portion of the field insulating layer that is between the first epitaxial pattern and the second epitaxial pattern is thicker, in a vertical direction, than a second portion of the field insulating layer that is between the first plurality of fin-shaped patterns, and the first portion of the field insulating layer is thicker, in the vertical direction, than a third portion of the field insulating layer that is between the second plurality of fin-shaped patterns, and
wherein the first portion of the field insulating layer contacts the first epitaxial pattern and the second epitaxial pattern.

17. The semiconductor device of claim 16, wherein a height from the bottommost surface of the fin trench to the bottommost surface of the first epitaxial pattern is smaller than a height from the bottommost surface of the fin trench to the bottommost surface of the second epitaxial pattern.

18. The semiconductor device of claim 16, wherein the first epitaxial pattern includes a facet intersection point along a sidewall thereof where its width in the second direction is at a maximum, and
    wherein the topmost surface of the field insulating layer is higher than the bottommost surface of the first epitaxial pattern and lower than the facet intersection point of the first epitaxial pattern.

19. The semiconductor device of claim 16, further comprising:
    a plurality of first wiring lines connected to the source/drain contact and at a first metal level; and
    a second wiring line at a second metal level higher than the first metal level and configured to connect the plurality of first wiring lines.

\* \* \* \* \*